United States Patent [19]
Itoh et al.

[11] Patent Number: 6,002,354
[45] Date of Patent: Dec. 14, 1999

[54] VARIABLE POTENTIAL GENERATING CIRCUIT USING CURRENT-SCALING ADDING TYPE D/A CONVERTER CIRCUIT

[75] Inventors: Yasuo Itoh, Kawasaki; Sumio Tanaka, Tokyo, both of Japan

[73] Assignee: Kabushiki Kaisha Toshiba, Kawasaki, Japan

[21] Appl. No.: 09/166,571

[22] Filed: Oct. 6, 1998

[30] Foreign Application Priority Data

Oct. 9, 1997 [JP] Japan ..................................... 9-277035

[51] Int. Cl.⁶ .............................. H03M 1/66; H03M 1/78
[52] U.S. Cl. .......................................... 341/144; 341/154
[58] Field of Search ..................................... 341/144, 154

[56] References Cited

U.S. PATENT DOCUMENTS

| | | | |
|---|---|---|---|
| 5,119,095 | 6/1992 | Asazawa | 341/154 |
| 5,302,951 | 4/1994 | Yamashita | 341/144 |
| 5,668,550 | 9/1997 | Coleman, Jr. | 341/144 |
| 5,870,049 | 2/1999 | Huang et al. | 341/144 |

FOREIGN PATENT DOCUMENTS

| | | |
|---|---|---|
| 2-13014 | 1/1990 | Japan . |
| 5-129959 | 5/1993 | Japan . |

OTHER PUBLICATIONS

"VLSI Design Techniques for Analog and Digital Circuits"; R.L. Geiger et al.; McGraw–Hill Pub. Company; p623–p625.

*Primary Examiner*—Trong Phan
*Attorney, Agent, or Firm*—Banner & Witcoff, Ltd.

[57] ABSTRACT

A variable potential generating circuit includes a resistive potential divider circuit and first and second operational amplifiers. The resistive potential divider circuit includes a switching element and a current-scaling type digital/analog converter circuit connected in series between a power supply node and a ground node. The resistive potential divider circuit has a first node at which a divided potential obtained by resistive division of a variable potential to be output from a variable potential output node appears and a second node to which a virtual potential is applied. The first operational amplifier compares the divided potential of the first node with a reference potential to effect the feedback control for setting the variable output potential equal to the reference potential. The second operational amplifier compares the virtual potential of the second node with the reference potential to effect the feedback control for setting the virtual potential equal to the reference potential.

17 Claims, 15 Drawing Sheets

VARIABLE POTENTIAL GENERATING CIRCUIT USING CURRENT-SCALING ADDING TYPE D/A CONVERTER CIRCUIT

BACKGROUND OF THE INVENTION

This invention relates to a semiconductor integrated circuit device and a semiconductor memory, and more particularly to a variable potential generating circuit for selectively generating a plurality of different potentials by use of a current-scaling type digital/analog (D/A) converter circuit and can be applied to a multistage voltage generating circuit for data writing and data erasing in a nonvolatile semiconductor memory, for example.

A variable potential generating circuit is used to generate a plurality of different potentials in a semiconductor integrated circuit device and supply the generated potential to an internal circuit. When a D/A converter circuit is used in part of the variable potential generating circuit, a resistive potential dividing type D/A converter as shown in FIG. 1 or a current-scaling type D/A converter as shown in FIG. 2 is conventionally used, for example.

The resistive potential dividing type D/A converter shown in FIG. 1 includes dividing resistors $R_0$ to $R_{16}$, switching elements $S_1$ to $S_{16}$, operational amplifier 11, P-channel MOS (PMOS) transistor 12 and decoder circuit 13. The inverting input terminal (−) of the operational amplifier 11 is applied with a reference potential $V_R$. The source of the PMOS transistor 12 is connected to a Vcc node to which a power supply potential Vcc is applied, and the gate thereof is connected to the output terminal of the operational amplifier 11. The operational amplifier 11 and PMOS transistor 12 are used for feedback control. The dividing resistors $R_0$ to $R_{16}$ are serially connected between the drain of the PMOS transistor 12 and a Vss node to which a ground potential Vss is applied. The switching elements $S_1$ to $S_{16}$ are connected between the voltage dividing nodes of the dividing resistors $R_0$ to $R_{16}$ and the non-inverting input terminal (+) of the operational amplifier 11. The decoder circuit 13 is provided for each of the switching elements $S_1$ to $S_{16}$ to decode digital signals $A_0$ to $A_3$ and control the switching states of the switching elements $S_1$ to $S_{16}$ according to the decoded outputs. In FIG. 1, the digital signals $A_0$, $A_1$, $A_2$, $A_3$ are "0101", the switching element $S_{11}$ is selected and set in the ON state, and the switching elements $S_1$ to $S_{10}$ and $S_{12}$ to $S_{16}$ are non-selected and set in the OFF state. A variable output potential Vout corresponding to the switching states of the switching elements $S_1$ to $S_{16}$ is obtained from the variable potential output node connected to a connection node of the drain of the PMOS transistor 12 and the resistor $R_0$.

In the resistive voltage dividing type D/A converter circuit, the relation of $Vout=(R_T/R)V_R$ can be obtained if the number of steps of the output voltage Vout is relatively small when the total resistance of the dividing resistors $R_0$ to $R_{16}$ is set to $R_T$ and the resistance between the voltage dividing node selected by the switching elements $S_1$ to $S_{16}$ and the ground potential node Vss is R.

However, the number of voltage dividing resistors increases as the number of output steps increases, the number of decoder circuits 13 for controlling the switching elements $S_1$ to $S_{16}$ for selection of the voltage dividing node increases and the pattern occupying area is increased. For example, if 32 output voltages are required, it is necessary to prepare 33 voltage dividing resistors and 32 5-input decoder circuits for decoding 5-bit digital data. Generally, when the number of steps of the output voltage is $2^N$, it is necessary to form $2^N$ resistive dividing nodes and $2^N$ N-input decoder circuits for processing an N-bit digital input.

Therefore, if the value of N becomes larger, the numbers of decoder circuits and resistor elements rapidly increase and the pattern occupying area is increased, thereby making it difficult to design the circuit. In addition, since the degree of freedom of pattern change is low, it is difficult to cope with a variation in the resistance caused in the manufacturing process and it is difficult to change the design for adjustment of the resistance.

In order to solve the above problem, some decoding systems for directly decoding a digital input by use of a combination of resistors without using the decoder circuits are proposed. For example, a current-scaling type D/A converter circuit, voltage-scaling type D/A converter circuit, weighted resistor type D/A converter circuit are proposed. Among them, the current-scaling type D/A converter circuit is most frequently used.

FIG. 2 shows a known current-scaling type D/A converter circuit (refer to "Introduction to Illustrated D/A Converter by Toshikazu Yoneyama, Ohmsha, 1993", for example). Generally, the current-scaling type D/A converter circuit includes a resistor network having two types of resistors (resistances R and 2R) connected in a ladder form, n switching elements whose switching states are controlled by n-bit digital data and an operational amplifier. That is, nine resistors R each having a resistance R are serially connected, one end of the series-connected resistors R is applied with a reference potential $V_R$, and the other end thereof is connected to a Vss node to which a ground potential Vss (0V) is applied. One-side ends of the resistors R are respectively connected to one-side ends of 8 resistors 2R each having a resistance 2R to form an R-2R type ladder resistor circuit network. The other ends of the 8 resistors having the resistance 2R are connected to switching elements $S_1$ to $S_8$, one switching terminal of each of the switching elements $S_1$ to $S_8$ is connected to the inverting input terminal (−) of the operational amplifier 11 and the other switching terminal thereof is connected to the Vss node. A feedback resistor Rf with a resistance R is connected between the inverting input terminal (−) of the operational amplifier 11 and a variable potential output node and the non-inverting input terminal (+) thereof is connected to the Vss node. The operational amplifier 11 functions to hold the voltage of the inverting input terminal (−) (common connection node B) at 0V.

In the ladder resistor circuit network, attention is paid to a connection node $a_8$ in the resistor string (series-connected resistors R between the reference potential node $V_R$ and the Vss node). The resultant resistance when viewing the ground potential Vss side from the connection node $a_8$ becomes R+R=2R, and the resistance when viewing the resistor 2R side (switching element side) from the connection node $a_8$ and the resultant resistance when viewing the ground potential Vss side become 2R and are equal to each other.

Therefore, if a current flowing from the reference potential $V_R$ side into the connection node $a_8$ is set to $I_7$, a current $I_8'$ flowing from the connection node $a_8$ towards the resistors 2R and a current $I_8$ flowing into the ground potential Vss side are equal to each other and the following equation is obtained.

$$I_8'=I_8=I_7/2$$

Next, attention is paid to a connection node $a_7$ which is directly adjacent to the connection node $a_8$ of the resistor string on the reference potential $V_R$ side and the resultant resistance when viewing the ground potential Vss side from the connection node $a_7$ becomes 2R as shown by the following equation.

$$R + \cfrac{1}{\cfrac{1}{2R} + \cfrac{1}{R+R}} = 2R \qquad \text{[Equation 1]}$$

Therefore, since the resultant resistance when viewing the ground potential Vss side from the connection node $a_7$ and the resistance when viewing the resistor 2R become 2R and are equal to each other, a current $I_6$ flowing from the reference potential $V_R$ side is equally divided into a current $I_7'$ flowing towards the resistor 2R side and a current $I_7$ flowing towards the ground potential Vss side and the following equation is obtained.

$$I_7' = I_7 = I_6/2$$

As described above, if attention is sequentially paid to the connection nodes of the resistor string in an order towards the reference potential $V_R$ side, the resultant resistance when viewing the ground potential Vss side from each connection node can be expressed by the continued fraction indicated by the following equation and becomes equal to the resistance when viewing the resistor 2R.

$$R + \cfrac{1}{\cfrac{1}{2R} + \cfrac{1}{R + \cfrac{1}{\cfrac{1}{2R} + \cdots \cfrac{1}{R + \cfrac{1}{\cfrac{1}{2R} + \cfrac{1}{R+R}}}}}} = 2R \qquad \text{[Equation 2]}$$

Therefore, in each connection node, a current flowing from the reference potential $V_R$ side is equally divided into a current flowing towards the resistor 2R side and a current flowing into the ground potential Vss side.

That is, if a current flowing from the reference potential $V_R$ into the resistance circuit network is set to $I_0$, currents flowing from the respective connection nodes sequentially set in an order from the reference potential $V_R$ side to the ground potential Vss side in the resistor string into corresponding switching elements $S_1$ to $S_8$ are sequentially weighted with $I_0/2, I_0/4, I_0/8, \ldots, I_0/2^N$.

Then, currents flowing into the common connection node B of the switching elements $S_1$ to $S_8$ are added in the operational amplifier 11 and converted into a voltage and thus a D/A conversion output (variable output potential) Vout can be obtained.

Further, the current $I_0$ flowing from the reference potential $V_R$ into the resistance circuit network is expressed by the following equation.

$$I_0 = -V_R/R$$

Therefore, the D/A converter output voltage Vout can be obtained as follows and expressed by the product of the reference potential $V_R$ and the digital input.

$$V_{out} = -\frac{V_R}{R}\left(\sum_{i=1}^{8} Ai 2^{-i}\right) R \qquad \text{[Equation 3]}$$

As described above, in the current-scaling type D/A converter circuit shown in FIG. 2, the switching element group connected to the resistance circuit network is directly controlled by the digital input and since a large number of digital decoder circuits as is required in the circuit shown in FIG. 1 are not necessary, the pattern occupying area can be reduced. Further, since the number of types of the unit resistances used in the resistance circuit network is small (two types having resistances of R and 2R), the circuit design can be easily made. Particularly, this is an effective system when the number n of bits of the digital input becomes larger.

However, if the current-scaling type D/A converter circuit of FIG. 2 is directly used in the power supply potential generating circuit, a problem occurs by the following two reasons.

(1) Since an output voltage Vout obtained after D/A conversion is a negative potential and a negative power supply potential is necessary, it is impossible to generate a positive variable potential which is normally used.

(2) The number of unit resistors R and 2R of the resistor circuit network increases (in the above example, the digital input is 8 bits, and nine resistors with the resistance R and eight resistors with the resistance 2R are used) as the number n of bits of the digital input increases, and it becomes necessary to use resistors with a high resistance in order to reduce the power consumption in the case of a circuit operated in the standby mode. As a result, since the pattern occupying area of the resistors R and 2R becomes extremely larger in comparison with the resistive voltage dividing system which is simple in construction, the pattern occupying area of the whole D/A converter circuit cannot be reduced even if the decoder circuits can be made unnecessary.

BRIEF SUMMARY OF THE INVENTION

Accordingly, a first object of this invention is to provide a semiconductor integrated circuit device having a variable potential generating circuit capable of suppressing an increase in the ratio of a pattern area of the resistor circuit network even if the number of bits of a digital input increases and relatively easily outputting a positive potential between a reference potential and a power supply potential higher than the reference potential in a multistage fashion by use of a current-scaling type D/A converter circuit.

A second object of this invention is to provide a semiconductor memory having a multistage voltage generating circuit capable of suppressing an increase in the ratio of a pattern area of the resistor circuit network even if the number of bits of a digital input increases and relatively easily outputting a positive potential between a reference potential and a power supply potential higher than the reference potential in a multistage fashion by use of a current-scaling type D/A converter circuit.

The first object of this invention can be attained by a semiconductor integrated circuit device comprising a resistive potential divider circuit including a switching element and a current-scaling type digital/analog converter circuit connected in series between first and second potential nodes and having a variable potential output node for outputting a variable potential, a first node at which a divided potential obtained by resistive division of the variable potential appears, and a second node to which a virtual potential is applied; a first operational amplifier for comparing one of the divided potential of the first node and the virtual potential of the second node with a reference potential to effect the feedback control for setting the one of the divided potential and the virtual potential equal to the reference potential; and a voltage application circuit for controlling the other of the divided potential of the first node and the virtual potential of the second node substantially equal to the reference potential.

With the above construction, a positive potential between the reference potential and a power supply potential higher than the reference potential can be relatively easily output in a multistage fashion by using the current-scaling type D/A converter circuit for directly decoding a digital input to effect the D/A conversion and using a virtual potential equal to the reference potential. Since the circuit does not require a large number of digital decoder circuits as required in the conventional resistive potential dividing type D/A converter circuit, a pattern area can be greatly reduced. Further, a pattern occupying area of two types of resistor elements which occupy a large area in the variable potential generating circuit can be reduced by dividing the resistive potential divider circuit into a high-resistance resistor and a plurality of unit resistors of low resistance and setting the resistances of the two types of resistor elements 2R and R which are repeatedly used smaller than the resistance of the high-resistance resistor. This advantage becomes more significant as the number of bits of the digital input becomes larger.

Therefore, it is possible to provide a semiconductor integrated circuit device having a variable potential generating circuit in which a positive potential between the reference potential and the power supply potential higher than the reference potential can be relatively easily output in a multistage fashion by using the current-scaling type D/A converter circuit and an increase in the ratio of the pattern area of the resistor circuit network can be suppressed even if the number of bits of the digital input is increased.

Further, the first object of this invention can be attained by a semiconductor integrated circuit device comprising a first PMOS transistor connected between a power supply node and a variable potential output node; a first resistor element connected at one end to the variable potential output node; a plurality of first switching elements commonly connected at one-side ends thereof to a first node on the other end side of the first resistor element, the switching states of the first switching elements being controlled by respective bit signals of a digital input; a plurality of second switching elements commonly connected at one-side ends thereof to a second node and respectively connected at the other ends to the other ends of the first switching elements, the switching states of the second switching elements being controlled by signals which are complementary to the respective bit signals of the digital input; a ladder resistor circuit network having a plurality of second resistor elements and a plurality of third resistor elements connected in a ladder form, the second resistor elements being connected at one-side ends thereof to a plurality of connection nodes of the plurality of first switching elements and the plurality of second switching elements and the third resistor elements being string-connected; a fourth resistor element connected between one end of the plurality of third resistor elements string-connected in the ladder resistor circuit network and a ground node; a first operational amplifier for comparing a divided potential obtained at the first node with the reference potential and controlling a gate potential of the first PMOS transistor based on a comparison output to effect the feedback control to set the divided potential equal to the reference potential; and a voltage application circuit for applying a virtual potential which is substantially equal to the reference potential to the second node.

With the above construction, a positive potential between the reference potential and a power supply potential higher than the reference potential can be relatively easily output in a multistage fashion by using the current-scaling type D/A converter circuit for directly decoding a digital input to effect the D/A conversion and using a virtual potential equal to the reference potential. Since the circuit does not require a large number of digital decoder circuits as required in the conventional resistive potential dividing type D/A converter circuit, a pattern area can be greatly reduced. Further, a pattern occupying area of two types of resistor elements which occupy a large area in the variable potential generating circuit can be reduced by dividing the resistive potential divider circuit into a high-resistance resistor and a plurality of unit resistors of low resistance and setting the resistances of the two types of resistor elements 2R and R which are repeatedly used smaller than the resistance of the high-resistance resistor. This advantage becomes more significant as the number of bits of the digital input becomes larger.

As a result, it becomes possible to provide a semiconductor integrated circuit device having a variable potential generating circuit in which a positive potential between the reference potential and the power supply potential higher than the reference potential can be relatively easily output in a multistage fashion by using the current-scaling type D/A converter circuit and an increase in the ratio of the pattern area of the resistor circuit network can be suppressed even if the number of bits of the digital input is increased.

Further, the second object of this invention can be attained by a semiconductor memory comprising an oscillation circuit whose ON/OFF state of oscillation operation is controlled by an oscillation enable signal, for generating a clock signal in a preset cycle in the ON state of oscillation operation state; a booster circuit for raising a power supply voltage and supplying a preset high voltage when it is supplied with the clock signal; a voltage limiter circuit connected to an output node of the booster circuit, for limiting an output voltage of the booster circuit to a desired value according to a control data input by use of a current-scaling type digital/analog converter circuit; and a memory cell array in which data is programmed by use of the voltage set by the voltage limiter circuit.

With the above construction, since the voltage limiter circuit for limiting the output voltage of the booster circuit to a desired value according to the control data input by use of the current-scaling type digital/analog converter circuit is provided, a large number of digital decoder circuits as required in a case wherein the conventional resistive potential dividing type D/A converter circuit is used is not required, and therefore, a pattern area can be greatly reduced. Further, it becomes possible to provide a semiconductor memory having a multistage voltage generating circuit in which a positive potential between the reference potential and the power supply potential higher than the reference potential can be relatively easily output in a multistage fashion by using the current-scaling type D/A converter circuit and an increase in the ratio of the pattern area of the resistor circuit network can be suppressed even if the number of bits of the digital input is increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

First Embodiment

Figure 3:
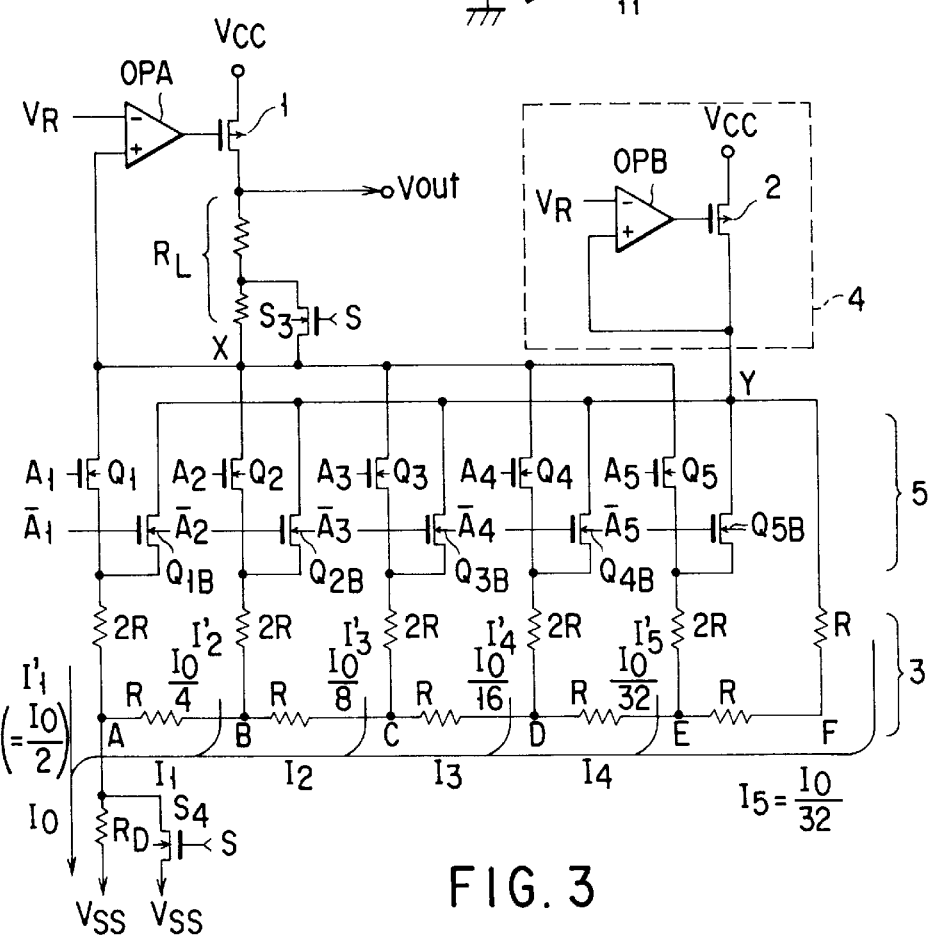
FIG. 3 is a circuit diagram showing a variable potential generating circuit, for illustrating a semiconductor integrated circuit device according to a first embodiment of this invention.

FIG. 3 is a circuit diagram showing a variable potential generating circuit, for illustrating a semiconductor integrated circuit device according to a first embodiment of this invention.

The variable potential generating circuit shown in FIG. 3 includes first and second operational amplifiers OPA, OPB, first and second PMOS transistors 1, 2, first resistor element $R_L$, n (in this example, n=5) first switching elements (N-channel MOS (NMOS) transistors) $Q_1$ to $Q_5$, n second switching elements (NMOS transistors) $Q_{1B}$ to $Q_{5B}$, n second resistor elements 2R, (n+1) third resistor elements R, fourth resistor element $R_D$, and third and fourth switching elements $S_3$, $S_4$. The second resistor elements 2R and the third resistor elements R are connected in a ladder form to constitute an R-2R type ladder resistor circuit network 3. The first switching elements $Q_1$ to $Q_5$ and the second switching elements $Q_{1B}$ to $Q_{5B}$ constitute a switching circuit network 5 and are selectively controlled to a state in which one of the first node X and second node Y is selected based on bit signals $A_1$ to $A_5$ and $\overline{A_1}$ to $\overline{A_5}$ of the digital input. The ladder resistor circuit network 3 and the switching circuit network 5 constitute the main portion of a current-scaling type digital/analog converter circuit. Further, the second PMOS transistor 2 and the second operational amplifier OPB constitute a voltage application circuit 4. A connection node of the PMOS transistor 1 and the first resistor element $R_L$ acts as a variable potential output node and a connection node of the first resistor element $R_L$ and the first switching node of the switching circuit network 5 acts as a voltage dividing node (first node X). Further, a connection node of the voltage application circuit 4 and the second switching node of the switching circuit network 5 acts as a second node Y.

That is, a reference potential $V_R$ is applied to the inverting input terminal (−) of the first operational amplifier OPA, the output terminal thereof is connected to the gate of the PMOS transistor 1, and the non-inverting input terminal (+) thereof is connected to the first node X. The source-drain path of the first PMOS transistor 1 is connected between a Vcc node to which the power supply potential Vcc is applied and a variable potential output node from which a variable output potential Vout is derived. One end of the first resistor element $R_L$ is connected to the variable potential output node and the other end thereof is connected to the first node X. One-side ends of the current paths of the first switching elements $Q_1$ to $Q_5$ are commonly connected to the first node X and the switching states thereof are controlled according to the bit signals $A_1$ to $A_5$ of the digital input. One-side ends of the current paths of the second switching elements $Q_{1B}$ to $Q_{5B}$ are commonly connected to the second node Y and the switching states thereof are controlled according to signals $\overline{A_1}$ to $\overline{A_5}$ which are complementary to the bit signals of the digital input. The other ends of the current paths of the first switching elements $Q_1$ to $Q_5$ and the other ends of the current paths of the corresponding second switching elements $Q_{1B}$ to $Q_{5B}$ are commonly connected. One-side ends of the second resistor elements 2R are respectively connected to the common connection nodes of the switching elements. The third resistor elements R are connected in a string form and the other ends of the second resistor elements 2R are connected to connection nodes of the resistor string to form the ladder resistor circuit network 3. The fourth resistor element $R_D$ is connected between one end of the resistor string of the third resistor elements R in the ladder resistor circuit network 3 and a Vss node to which a ground potential Vss is applied. Further, a third switching element $S_3$ is connected between the intermediate node of the first resistor element $R_L$ and the first node X so as to short-circuit the path therebetween, a fourth switching element $S_4$ is connected so as to short-circuit the fourth resistor element $R_D$, and the switching states of the switching elements $S_3$ and $S_4$ are controlled by a control signal S. The voltage application circuit 4 is constructed by a voltage follower having the second operational amplifier OPB and second PMOS transistor 2. The inverting input terminal (−) of the second operational amplifier OPB is applied with the reference voltage $V_R$, the output terminal thereof is connected to the gate of the PMOS transistor 2, and the non-inverting input terminal (+) thereof is connected to the second node Y. The source-drain path of the second PMOS transistor 2 is connected between the Vcc node and the second node Y.

The first operational amplifier OPA compares a divided potential obtained at the first node X (voltage dividing node) with the reference potential $V_R$, controls the gate potential of the first PMOS transistor 1 based on the comparison output to effect the feedback control so as to set the divided potential equal to the reference potential $V_R$. The second operational amplifier OPB compares a virtual potential of the second node Y with the reference potential $V_R$ and controls the gate potential of the second PMOS transistor 2 based on the comparison output. Thus, the feedback control is effected by the voltage follower to set the virtual potential equal to the reference potential $V_R$ (which is called imaginary short). At this time, the second node Y is kept at the low impedance.

Next, the operation of the variable potential generating circuit shown in FIG. 3 is explained.

First, the outline of the operation is explained. The variable output potential Vout of the variable potential output node is changed when the resistance of the current-scaling type digital/analog converter circuit is changed according to the value of the digital input. In this case, the potentials of the first node X and second node Y are kept at the same potential as the reference potential $V_R$ during the operation of the variable potential generating circuit so that the same potential can be obtained even if either one of the first node X and the second node Y is selected when the switching state of the switching circuit network 5 is controlled in response to the bit signals $A_1$ to $A_5$ and $\overline{A_1}$ to $\overline{A_5}$ of the digital input.

Thus, it is important to satisfy the condition that the potentials of the first node X and the second node Y are kept at the same potential as the reference potential $V_R$, and if the condition is satisfied, the calculations for the resultant resistance as will be described below can be made possible.

Assume now that a current $I_4$ flows from one of the connection nodes, for example, node E of the resistor string of the ladder resistor circuit network 3. At this time, the resultant resistance when viewing the node F side on one end side of the resistor string from the node E becomes "R+R= 2R" and is equal to the resistance when viewing the second resistor element 2R side from the node E, and therefore, a current $I_5$ flowing into the node E from the node F side and a current $I_5'$ flowing into the node E from the first node X via the switching element $Q_5$ and second resistor element (2R) when the switching element $Q_5$ is turned ON or a current $I_5'$ flowing into the node E from the second node Y via the switching element $Q_{5B}$ and second resistor element (2R) when the switching element $Q_{5B}$ is turned ON are equal to each other. That is, $I_5'=I_5=I_4/2$.

Next, if a node D directly adjacent to the node E of the resistor string on the ground potential Vss side is considered, the resultant resistance when viewing the node E from the node D becomes R+R=2R and is equal to the resistance when viewing the second resistor element (2R) side, and therefore, the resistance can be expressed by the following equation.

$$R + \frac{1}{\frac{1}{2R}+\frac{1}{R+R}} = 2R \quad \text{[Equation 4]}$$

Therefore, the resultant resistance in the node D when viewing the node E and the resistance when viewing the second resistor element (2R) side become 2R and are equal to each other, and as a result, a current $I_4$ flowing from the node E into the node D and a current $I_4'$ flowing into the node D from the first node X via the switching element $Q_4$ and second resistor element (2R) when the switching element $Q_4$ is turned ON or a current $I_4'$ flowing into the node D from the second node Y via the switching element $Q_{4B}$ and second resistor element (2R) when the switching element $Q_{4B}$ is turned ON are equal to each other. That is, $I_4'=I_4=I_3/2$.

As described above, when attention is sequentially paid to the connection nodes of the resistor string towards the ground potential Vss side, the resultant resistance when viewing the node F from the final node A can be expressed by the continued fraction indicated by the following equation and becomes equal to the resistance when viewing the second resistor element (2R) side.

$$R + \cfrac{1}{\cfrac{1}{2R} + \cfrac{1}{R + \cfrac{1}{\cfrac{1}{2R} + \cfrac{1}{R + \cfrac{1}{\cfrac{1}{2R} + \cfrac{1}{R + \cfrac{1}{\cfrac{1}{2R} + \cfrac{1}{R+R}}}}}}}} = 2R \quad \text{[Equation 5]}$$

Therefore, in each of the resistor connection nodes, a current flowing towards the ground node Vss is obtained by the sum of equal currents flowing from the node F side and from the second resistor element (2R) side.

That is, if a current flowing from the ladder resistor circuit network 3 to the ground potential Vss side is set to $I_0$, currents flowing into the switching elements corresponding to the resistor connection nodes set in a direction from one end node A on the ground potential Vss side in the resistor string to the node F side are sequentially weighted with $I_0/2$, $I_0/4$, $I_0/8$, ..., $I_0/32$, and since the currents are added and converted into a voltage in the resistor circuit network 3, a variable output potential Vout output from the variable potential output node is expressed by the following equation.

$$V_{out} = \left(1 + \frac{R_L}{R+R_D}\sum_{i=1}^{5} 2^{-i}Ai\right)V_R \qquad \text{[Equation 6]}$$

Thus, the variable output potential Vout can be expressed by the product of the reference potential $V_R$ and the digital input.

In a case wherein it is desired to output the variable output potential Vout in a range of 0.5V to 2.7V in 32 steps (each step of 70.97 mV), Vout can be easily calculated if $V_R$ is 0.5V, R is fixedly set at 10 kΩ and the number of bits of the digital input is 5.

In the variable potential generating circuit shown in FIG. 3, it is desirable to set the first resistor element $R_L$ and fourth resistor element $R_D$ to a high resistance, for example, $R_D$=190 kΩ and $R_L$=908.4 kΩ in order to reduce a penetration current supplied from the power supply at the standby time.

Figure 4:
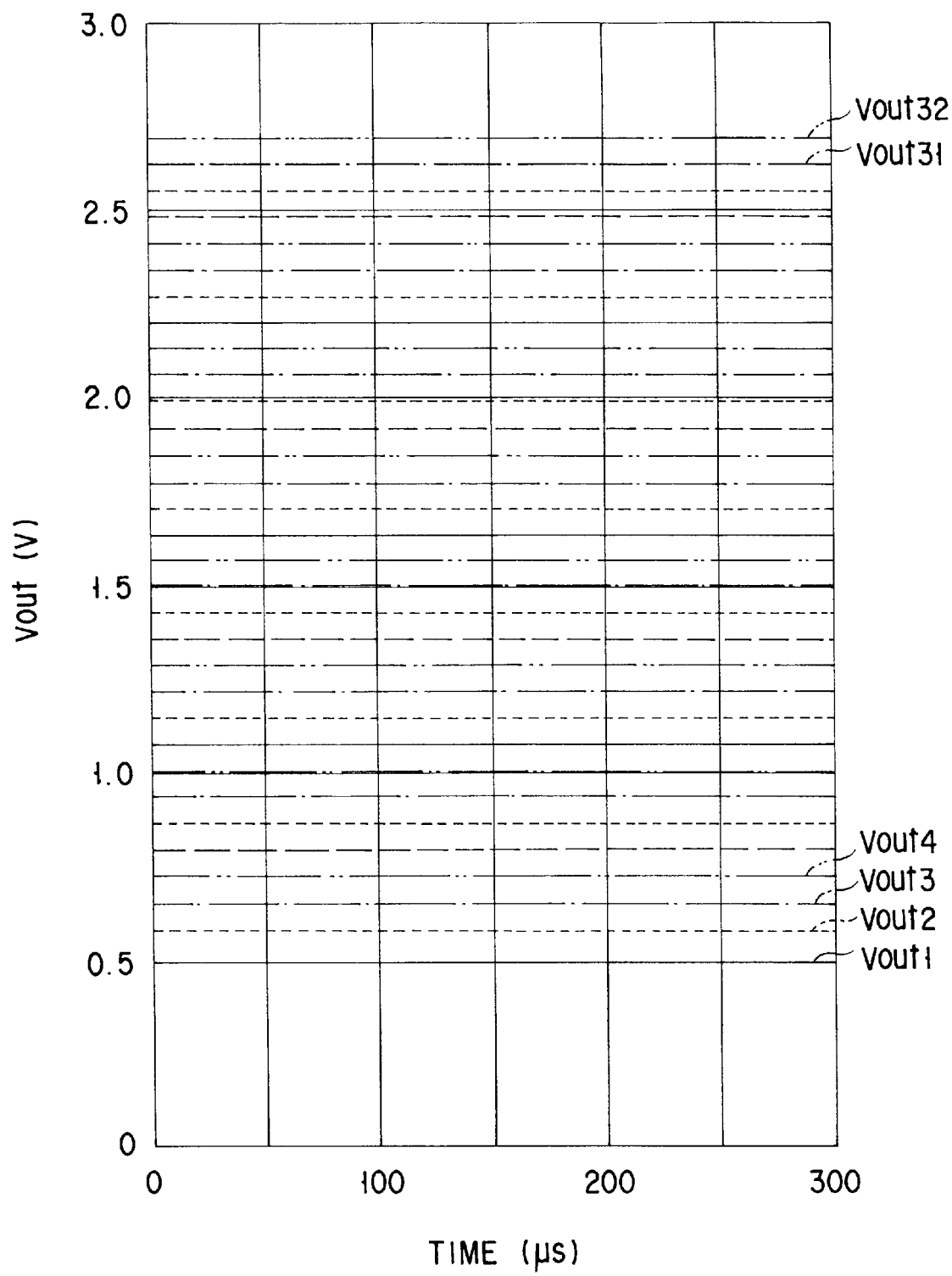
FIG. 4 is a diagram showing the simulation result of a variable output potential of the variable potential generating circuit shown in FIG. 3.

FIG. 4 shows the simulation result of the variable output potential Vout of the variable potential generating circuit shown in FIG. 3. It is clearly seen from FIG. 4 that variable output potentials Vout1 to Vout32 of 32 steps (each step of 70.97 mV) from 0.5V to 2.7V are output at equal intervals as calculated.

During the operation of the variable potential generating circuit shown in FIG. 3, it is desirable to set the first resistor element $R_L$ and fourth resistor element $R_D$ to a low resistance in order to enhance the response speed of rising even if a small amount of penetration current flows, and the third switching element $S_3$ and fourth switching element $S_4$ are set in the ON state by the control signal S and, for example, $R_D$=0Ω (short) and $R_L$=45.42 kΩ.

In other words, during the operation of the variable potential generating circuit shown in FIG. 3, the response speed is enhanced, and in the standby state, the ratio of the time constants depending on the circuit resistance and the load capacitance of the variable potential output node is changed to 1:20 in order to reduce the penetration current, but the resistance ratio $R_L/(R+R_D)$ is constant in the standby state and the operative state. In this example, the resistance ratio $R_L/(R+R_D)$ is as follows.

$R_L/(R+R_D)$=908.4/(10+190)=45.42/(10+0)=4.542

Therefore, the variable output potentials Vout in the standby state and in the operative state of the variable potential generating circuit shown in FIG. 3 can be set to exactly the same potential in principle.

Figure 1:
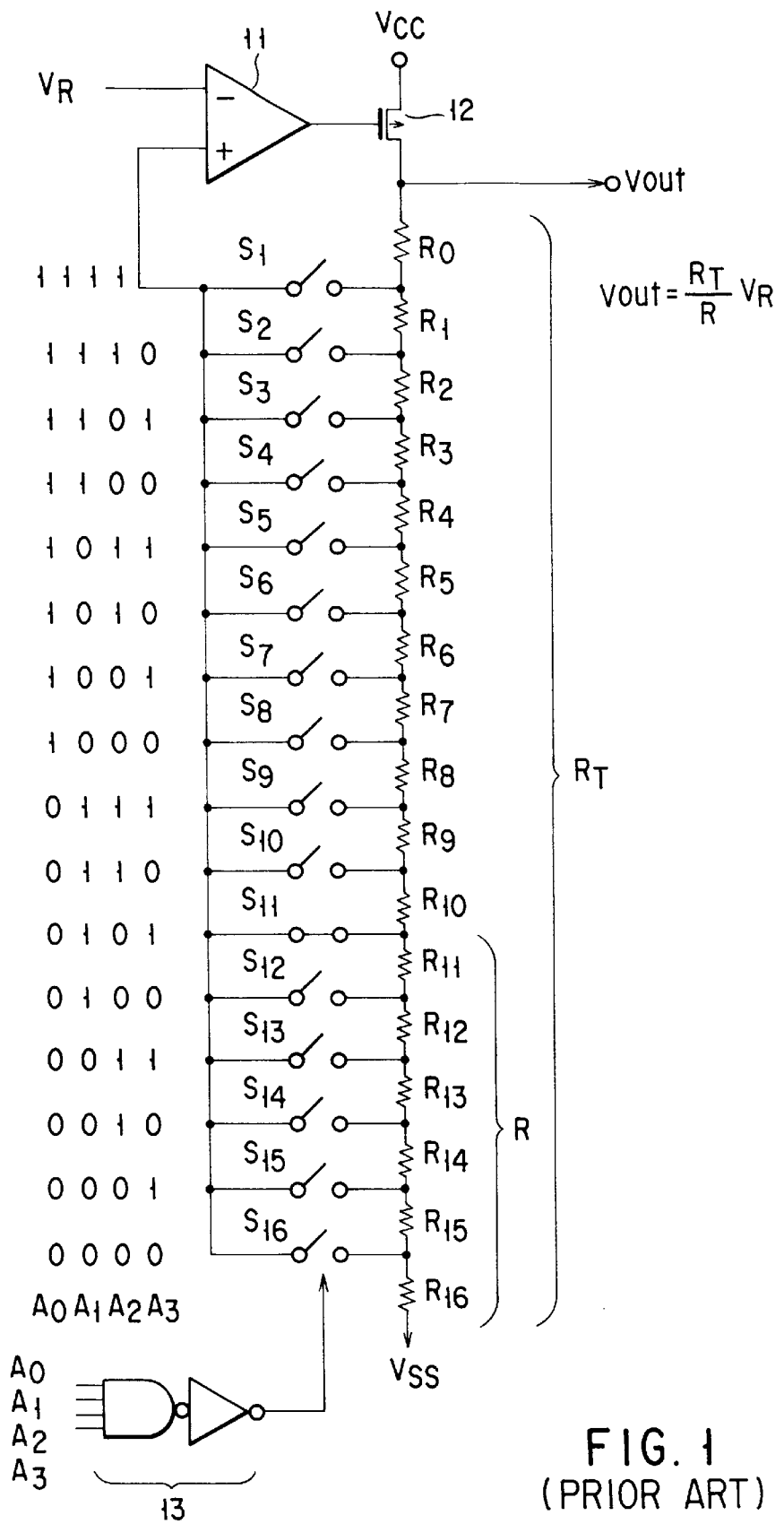
FIG. 1 is a circuit diagram showing one example of a conventional D/A converter circuit of resistive potential division type.
Figure 2:
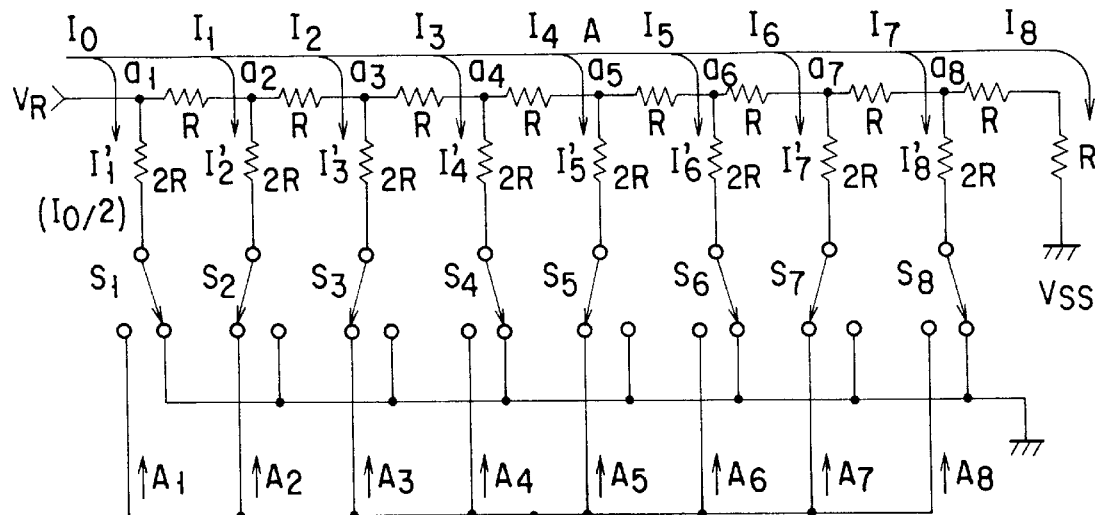
FIG. 2 is a circuit diagram showing one example of a conventional D/A converter circuit of current-scaling type.
Figure 2:
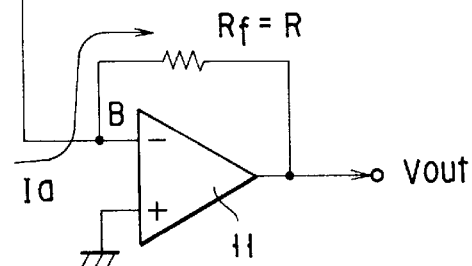

According to the variable potential generating circuit with the above construction, the current-scaling type D/A converter circuit for effecting the D/A conversion by directly decoding the digital input is used and the virtual potential equal to the reference potential is used so as to relatively easily output a positive potential between the reference potential and the power supply potential higher than the reference potential in a multistage fashion. Since the circuit does not require a large number of digital decoder circuits as required in the conventional resistive potential dividing type D/A converter circuit shown in FIG. 1, the pattern area can be greatly reduced. Further, a pattern occupying area of two types of resistor elements which occupy a large area in the variable potential generating circuit can be reduced by dividing the resistive potential divider circuit into a high-resistance resistor and a plurality of unit resistors of low resistance and setting the resistances of the two types of resistor elements 2R and R which are repeatedly used smaller than the resistance of the high-resistance resistor. This advantage becomes more significant as the number of bits of the digital input becomes larger.

Further, since the absolute value of the resistance can be easily changed without changing the ratio of the potential dividing resistors, the output impedance can be easily changed, the time constant can be easily set for the low-power consumption type to the high-speed following type, and the fine adjustment can be rapidly made according to a variation in the resistance at the manufacturing time, and thus an advantage that the circuit parameters can be easily adjusted can be attained. That is, according to the operative state in which the high-speed response is required and according to the standby state in which it is important to reduce the penetration current and suppress the wasteful consumption current to a minimum possible value, the ratio of the time constants (in the above example, 20 times) can be easily changed by slightly changing the circuit pattern (changing the resistances of the fourth resistor element $R_D$ and the first resistor element $R_L$) and when it is desired to change the time constant or the ratio of the time constants for some reason, a measure can be easily and rapidly taken by trimming.

Further, in the resistive potential divider circuit, it is general to use a polysilicon layer or diffusion layer as a resistor material, and the resistance of the polysilicon layer or diffused layer will vary at the manufacturing time, but the fine adjustment (trimming) of the resistor can be easily attained by use of the two parameters of the resistor elements $R_D$ and $R_L$. In this case, the value of the denominator (R+$R_D$) of the resistance ratio $R_L/(R+R_D)$ has a high degree of freedom of selection and the variable output potential Vout is kept unchanged even if R=10 kΩ and $R_D$=190 kΩ, R=1 kΩ and $R_D$=199 kΩ, or R=200 kΩ and $R_D$=0 kΩ, for example, in the condition in the standby state as described above.

Particularly, since the resistor elements 2R and R of a large number are used in the ladder resistor circuit network 3, it is preferable to make the pattern area as small as possible. Therefore, if the ON-resistance of the switching element of the switching circuit network 5 can be neglected, the pattern area of the resistor elements R can be made smaller by selecting R=1 kΩ and $R_D$=199 kΩ and the pattern area of the whole circuit can be made small. That is, the fourth resistor element $R_D$ and first resistor element $R_L$ inserted into part of the resistive potential divider circuit have a role of increasing the degree of freedom for setting the variable output potential Vout.

Modifications of The First Embodiment

FIGS. 5 to 8 are circuit diagrams showing modifications of the connection of the voltage application circuit or first operational amplifier OPA in FIG. 3.

Figure 5:
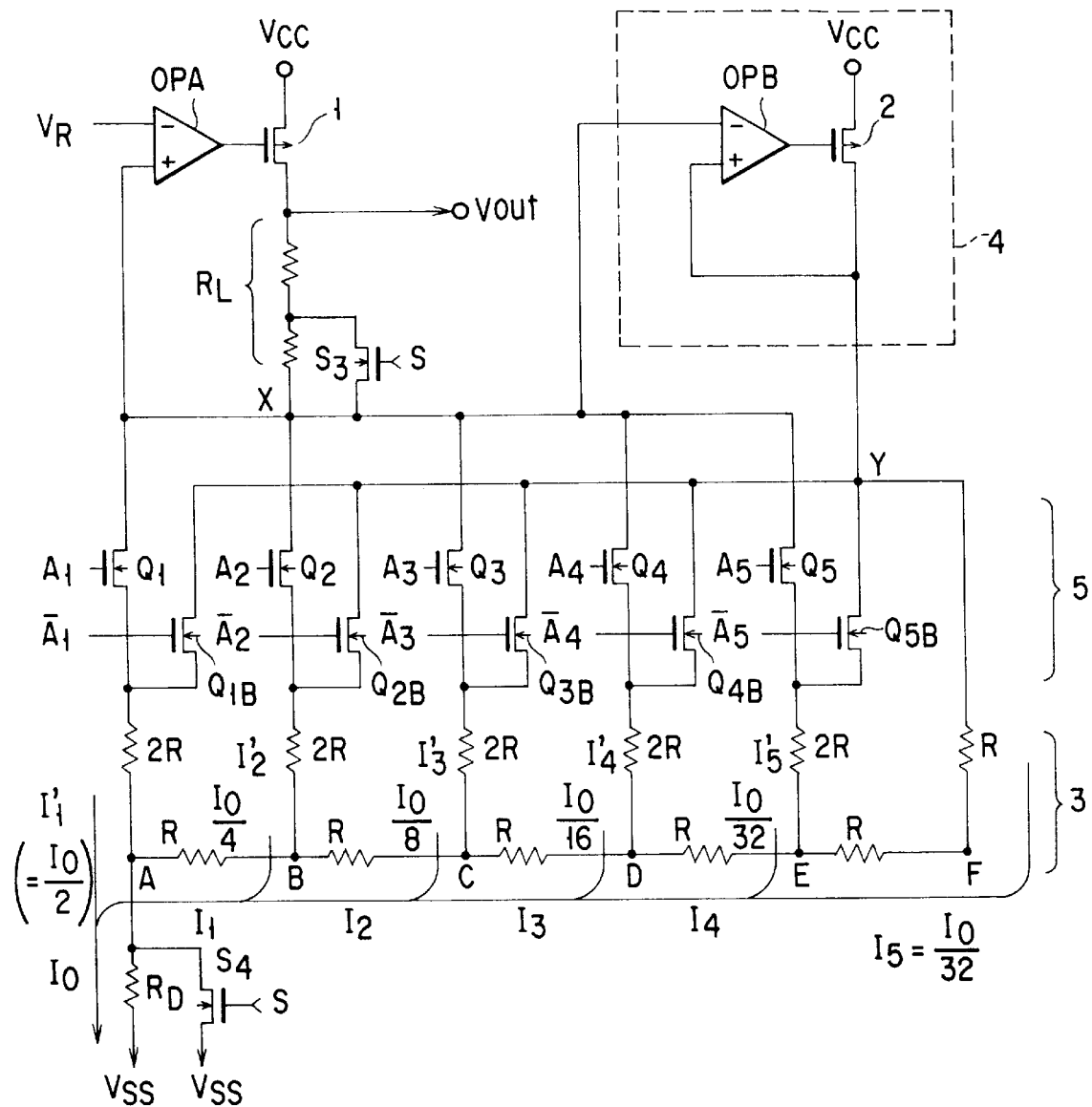
FIG. 5 is a circuit diagram showing a first modification of the variable potential generating circuit shown in FIG. 3.

In the circuit shown in FIG. 5, the inverting input terminal (−) of the operational amplifier OPB in the voltage application circuit 4 is connected to the first node X and divided potential is applied thereto, the non-inverting input terminal (+) thereof is connected to the second node Y and a virtual potential is applied thereto, and the output terminal thereof is connected to the gate of the PMOS transistor 2. Since the potential of the inverting input terminal (−) of the operational amplifier OPB is controlled to be set equal to the reference potential $V_R$ by the operational amplifier OPA, the circuit thus constructed is operated in substantially the same manner as in the circuit shown in FIG. 3 and the same effect can be attained.

Figure 6:
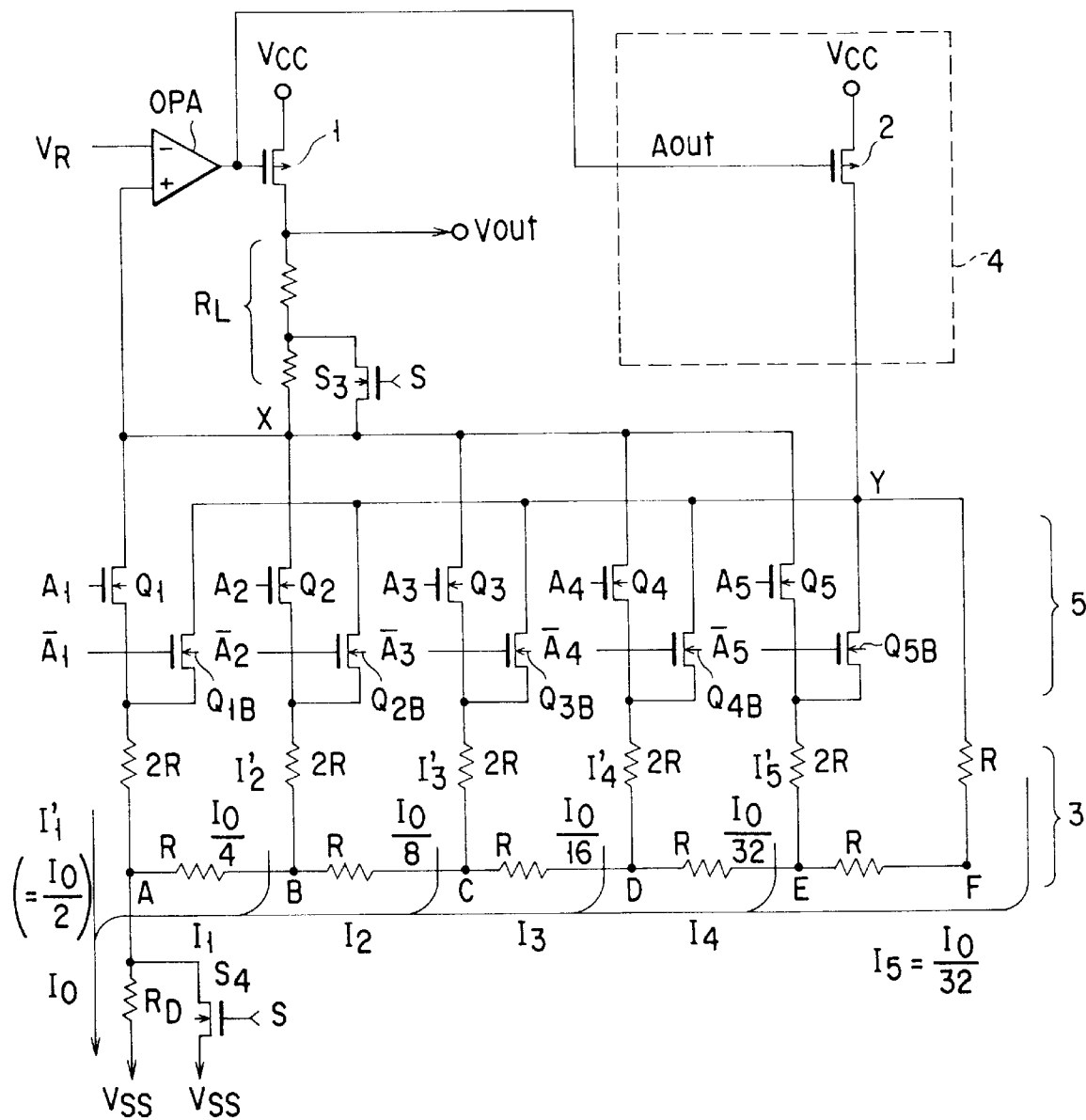
FIG. 6 is a circuit diagram showing a second modification of the variable potential generating circuit shown in FIG. 3.

Further, as shown in FIG. 6, the voltage application circuit 4 can be constructed only by the second PMOS transistor 2. In this case, the source-drain path of the PMOS transistor 2 is connected between the Vcc node and the second node Y and a potential Aout of the output node of the first operational amplifier OPA is applied to the gate thereof. In the case of this construction, the potential of the second node Y can be feedback-controlled to be set equal to the reference potential $V_R$ by the operational amplifier OPA. Thus, the same operation as that in the constructions of FIGS. 3 and 5 can be realized and substantially the same effect can be attained.

Figure 7:
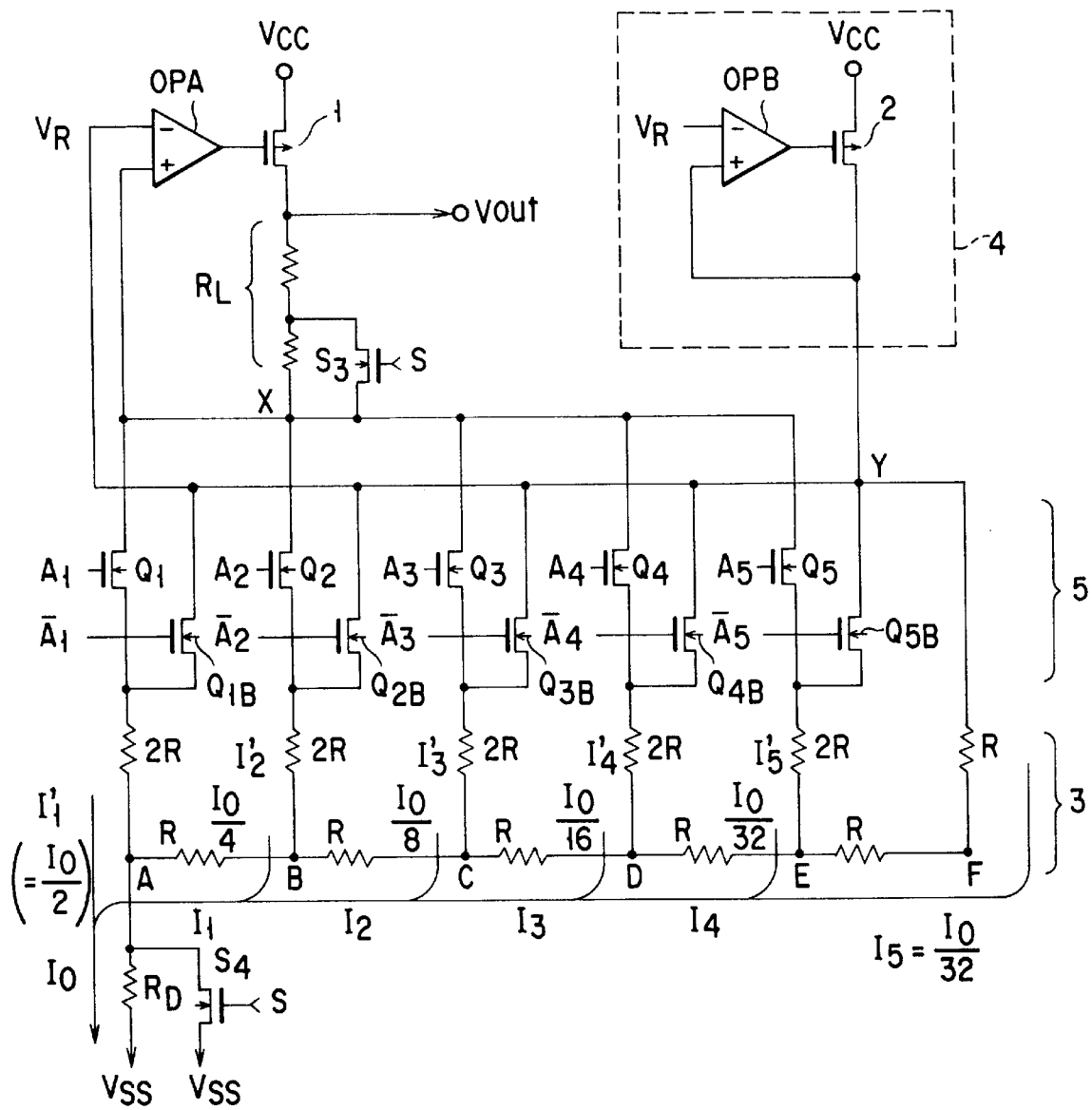
FIG. 7 is a circuit diagram showing a third modification of the variable potential generating circuit shown in FIG. 3.

Further, as shown in FIG. 7, the feedback control system (voltage application circuit 4) of the second node Y may be constructed by use of the PMOS transistor 2 and operational amplifier OPB in the same manner as in the construction shown in FIG. 3, the inverting input terminal (−) of the first operational amplifier OPA may be connected to the second node Y, the non-inverting input terminal (+) thereof may be connected to the first node X, and the output terminal thereof may be connected to the gate of the PMOS transistor 1. Since the potential of the second node Y is feedback-controlled to be set equal to the reference potential $V_R$ by the voltage application circuit 4, the potential of the first node X can be feedback-controlled so as to be set equal to the reference potential $V_R$ by the first operational amplifier OPA with the above construction. Therefore, with the above construction, the same operation as that of each of the above modifications can be effected and the same effect can be attained.

Figure 8:
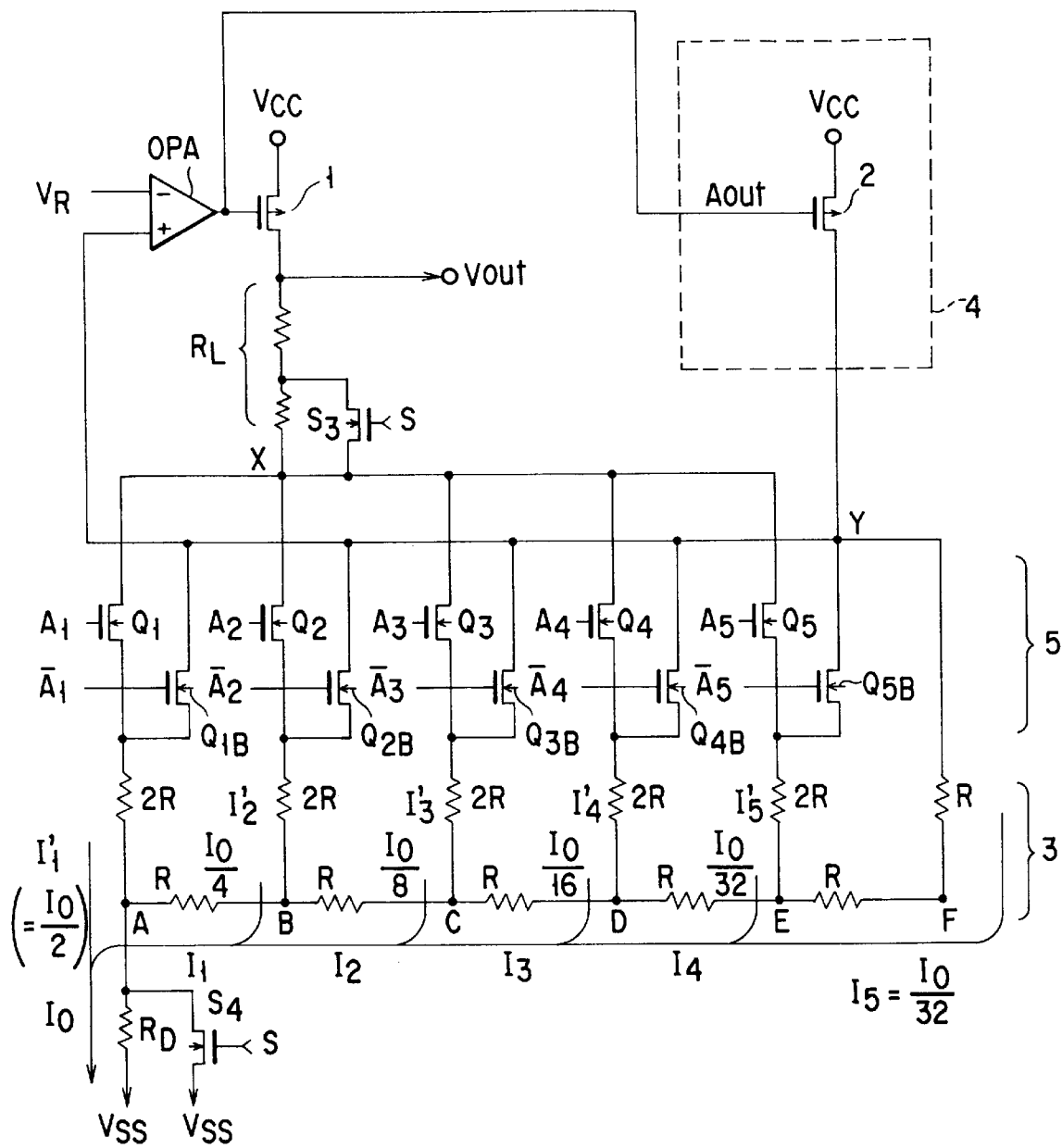
FIG. 8 is a circuit diagram showing a fourth modification of the variable potential generating circuit shown in FIG. 3.

As shown in FIG. 8, even if the non-inverting input terminal (+) of the operational amplifier OPA in the circuit shown in FIG. 6 is connected to the second node Y, the potentials of the first and second nodes X, Y can be feedback-controlled to be set equal to the reference potential $V_R$ and the same operation as that in each of the circuits shown in FIGS. 3, 5, 6 and 7 is effected and the same effect can be attained.

Among the modifications described above, in the circuits shown in FIGS. 6 and 8, since the feedback control system of the first node X and the feedback control system of the second node Y commonly use one operational amplifier, it is advantageous to reduce the pattern occupying area.

Other Modifications of The First Embodiment

Figure 9:
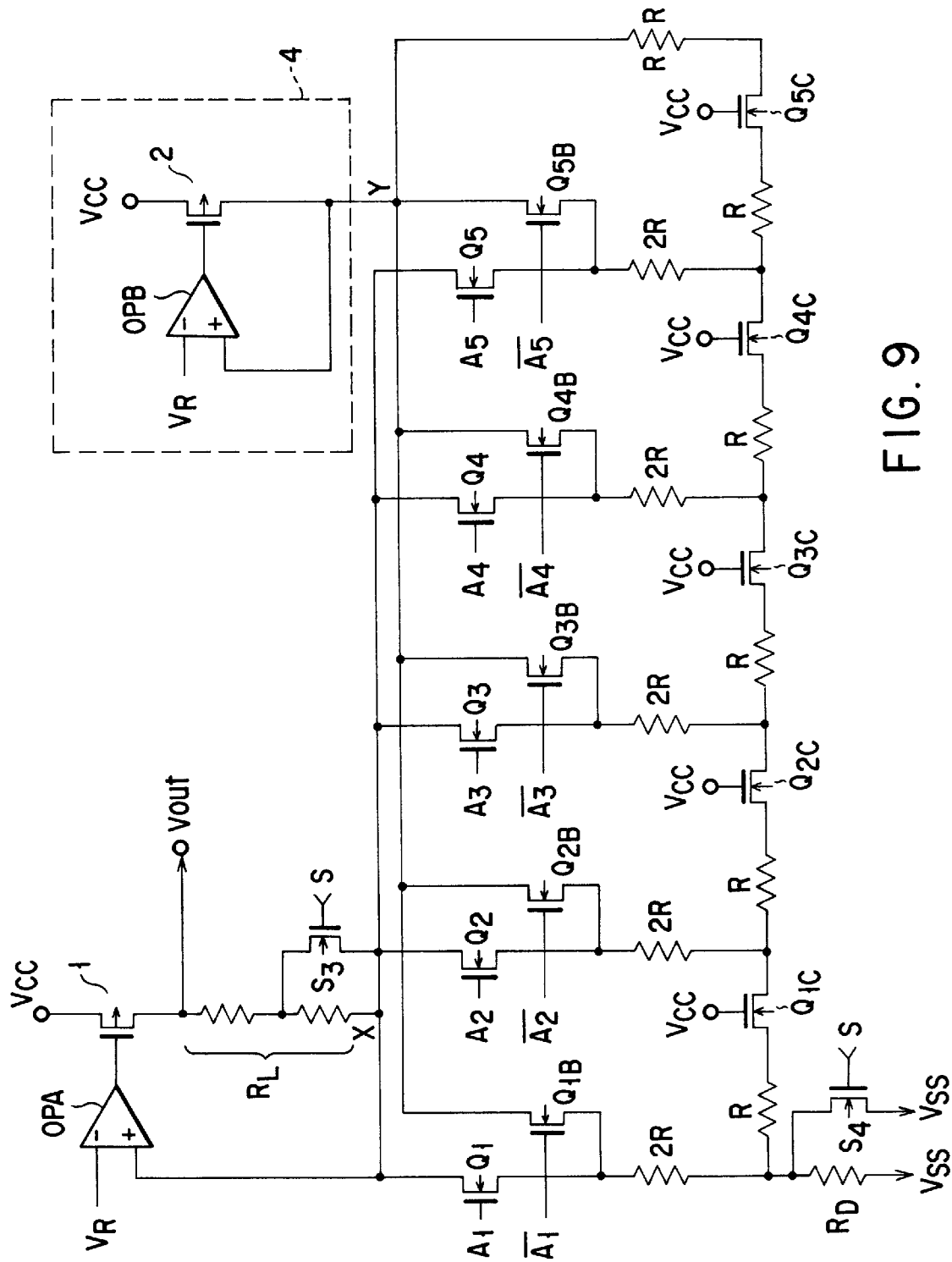
FIG. 9 is a circuit diagram showing a fifth modification of the variable potential generating circuit shown in FIG. 3.
Figure 10:
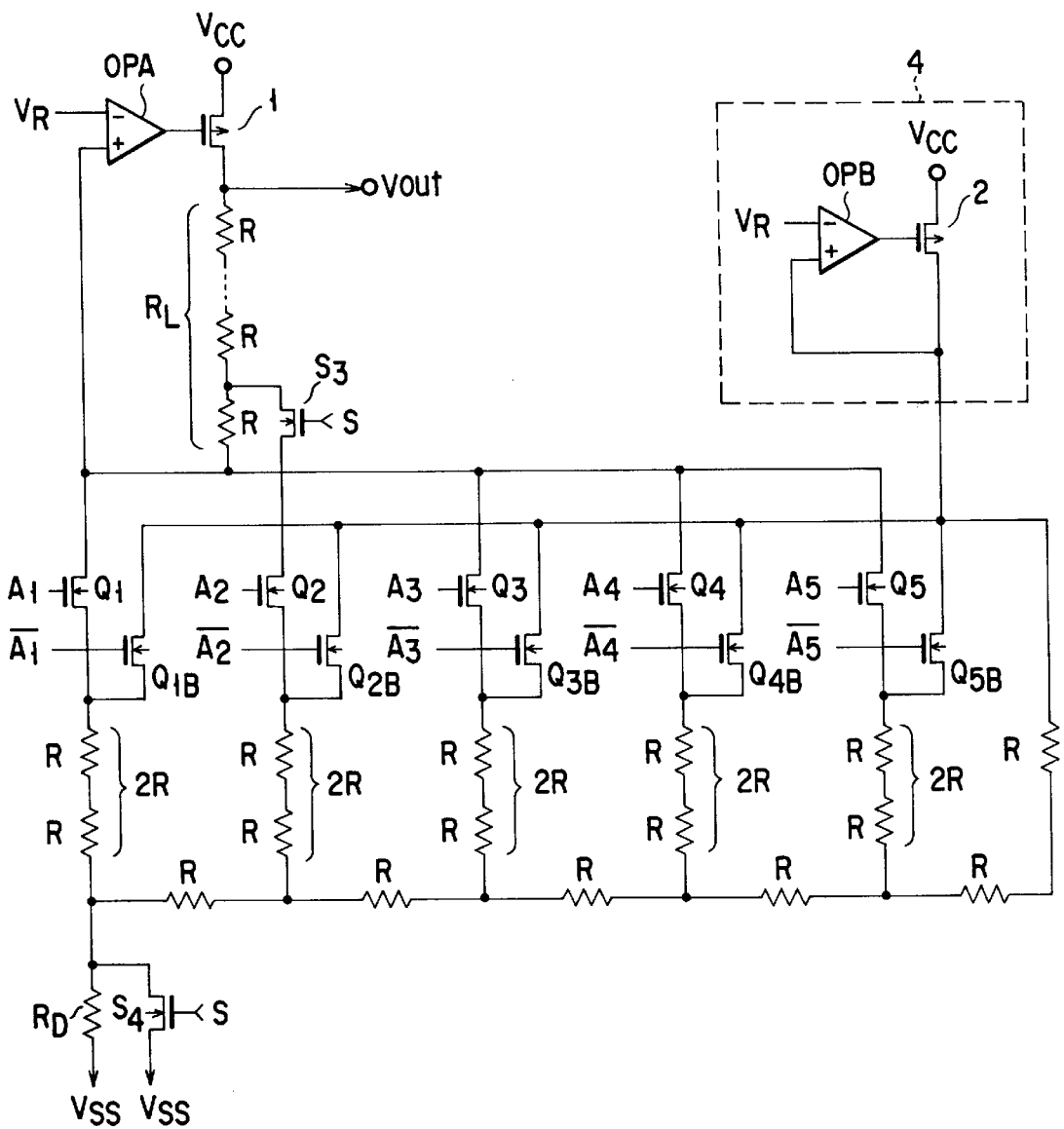
FIG. 10 is a circuit diagram showing a sixth modification of the variable potential generating circuit shown in FIG. 3.
Figure 11:
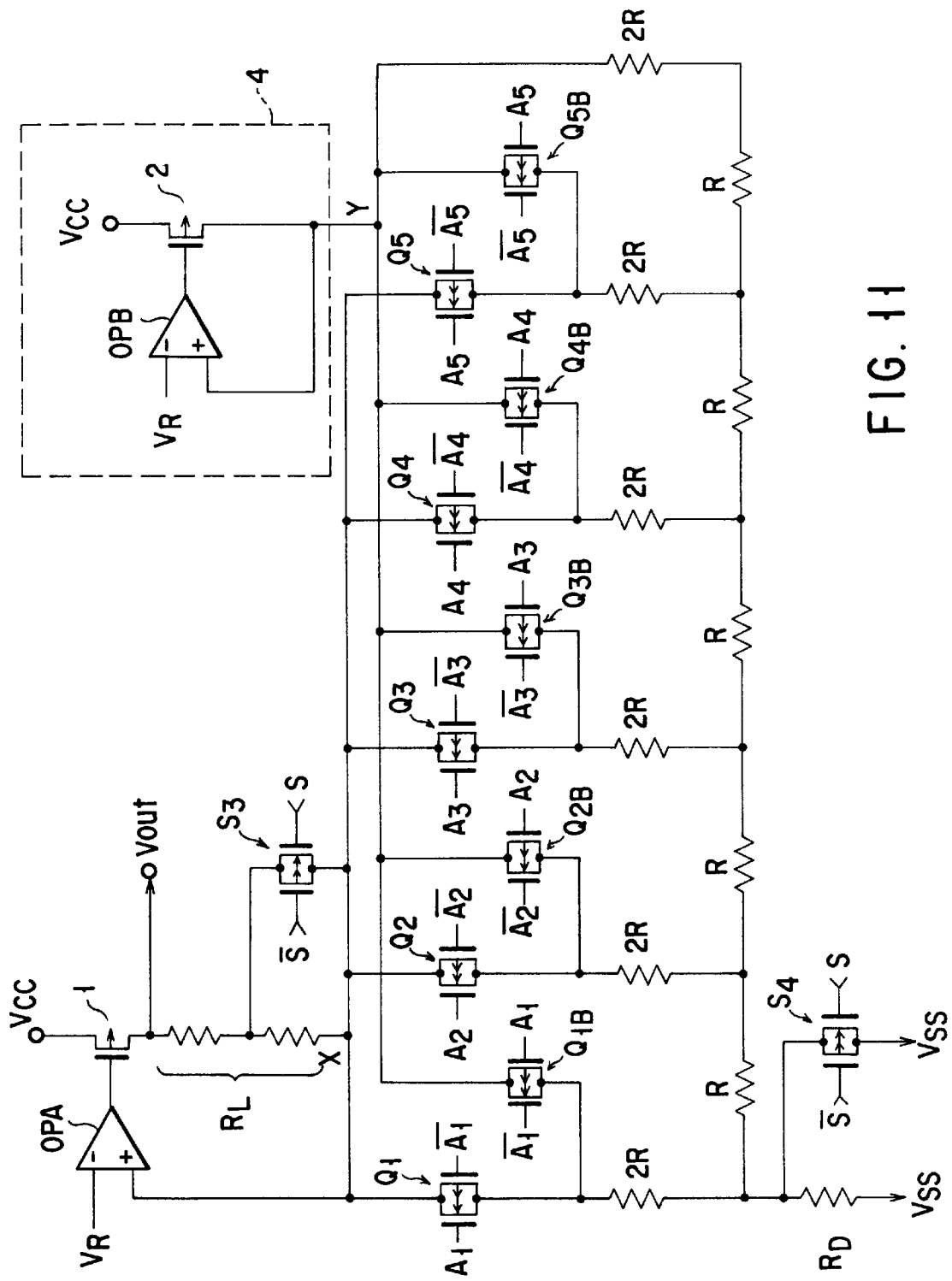
FIG. 11 is a circuit diagram showing a seventh modification of the variable potential generating circuit shown in FIG. 3.

FIGS. 9 to 11 are circuit diagrams showing modifications of the ladder resistor circuit network 3 or switching circuit network 5 in the variable potential generating circuit shown in FIG. 3.

In the circuit shown in FIG. 9, the current paths of NMOS transistors $Q_{1C}$ to $Q_{5C}$ are respectively inserted between the connection nodes of the third resistor elements R constituting the resistor string. A Vcc node applied with the power supply potential Vcc is connected to the gates of the NMOS transistors $Q_{1C}$ to $Q_{5C}$ to normally set the NMOS transistors in the ON state. The channel width of the NMOS transistors $Q_{1C}$ to $Q_{5C}$ is set equal to half the width of the NMOS transistors $Q_1$ to $Q_5$ which are the first switching elements and the NMOS transistors $Q_{1B}$ to $Q_{5B}$ which are the second switching elements, and the channel length thereof is set equal to that of the latter transistors. With this structure, since the influence on the ladder resistor circuit network by the ON-resistances of the NMOS transistors $Q_1$ to $Q_5$ or NMOS transistors $Q_{1B}$ to $Q_{5B}$ can be cancelled, the precision of the current-scaling type digital/analog converter circuit can be enhanced.

In the circuit shown in FIG. 10, the first resistor elements $R_L$, second resistor element 2R and third resistor element R are each constructed by use of an integer of resistor elements R. Each of the resistor elements R is formed of the same material and in the same manufacturing step and by use of the same pattern and the resistance thereof is determined by the number of the resistor elements R. For example, the second resistor element 2R can be obtained by serially connecting two resistor elements with a resistance R. Likewise, the first resistor elements $R_L$ can be obtained by serially connecting (or connecting in a parallel form or connecting in a series-parallel form) a plurality of resistor elements with a resistance R. Further, the fourth resistor element $R_D$ may be obtained by use of a plurality of resistor elements with a resistance R. Thus, the influence by a variation in the resistances due to the variation caused in the manufacturing process can be suppressed to minimum.

In the circuit shown in FIG. 11, the first switching elements $Q_1$ to $Q_5$, second switching elements $Q_{1B}$ to $Q_{5B}$, and third and fourth switching elements $S_3$, $S_4$ are each formed with the CMOS circuit construction by connecting the current paths of the PMOS transistor and NMOS transistor in parallel and complementary signals are input to the switching elements to control the ON/OFF states thereof. If the switching element is constructed only by the NMOS transistor, a high-level side potential is lowered by an amount corresponding to the threshold voltage of the NMOS transistor, but if it is constructed by a CMOS circuit, a lowering in the level by the threshold voltage can be suppressed and the high precision can be attained.

Figure 12:
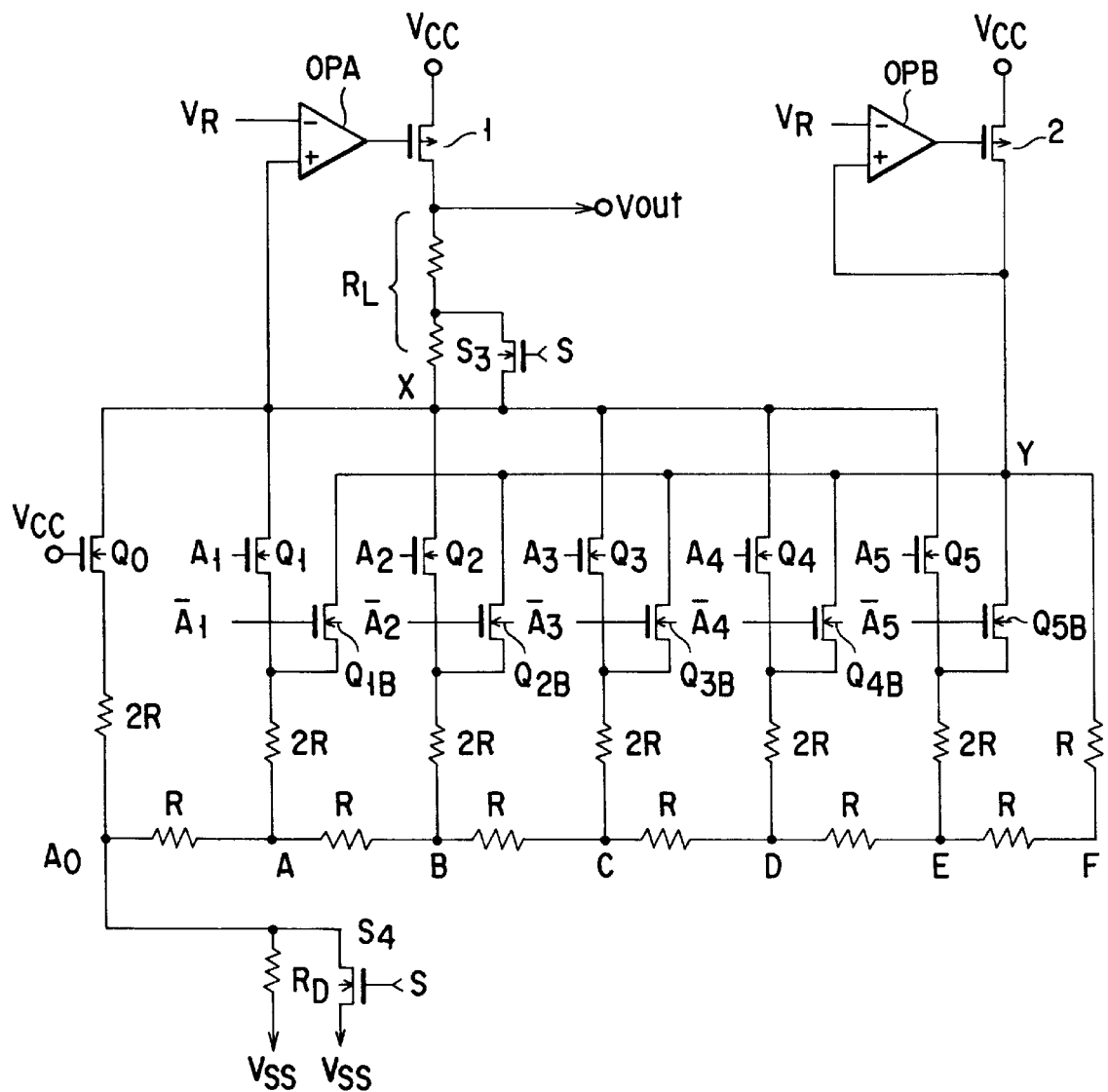
FIG. 12 is a circuit diagram showing a variable potential generating circuit, for illustrating a semiconductor integrated circuit device according to a second embodiment of this invention.
Figure 13:
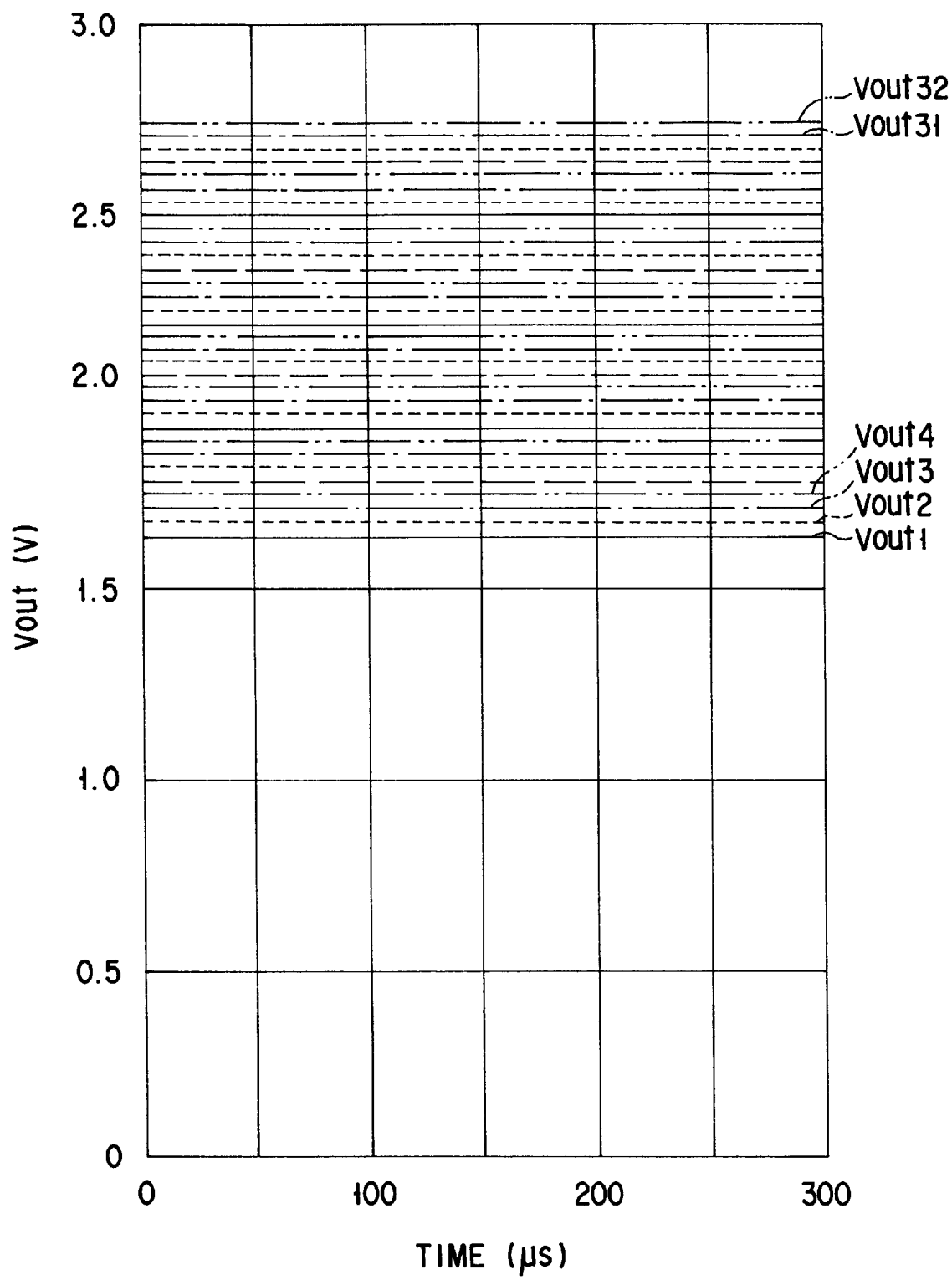
FIG. 13 is a diagram showing the simulation result of a variable output potential of the variable potential generating circuit shown in FIG. 12.

The circuit constructions shown in FIGS. 11 to 13 can be used in combination or can be used in combination with at least one of the modifications shown in FIGS. 3, 5 to 9.

Second Embodiment

FIG. 12 shows another example of the construction of the variable potential generating circuit, for illustrating a semiconductor integrated circuit device according to the second embodiment of this invention. The variable potential generating circuit is modified so that the lower limit of the variable output potential Vout may be raised in comparison with that of the variable potential generating circuit of the first embodiment and the variable output potential will be changed in the smaller step in a narrow range.

That is, the variable potential generating circuit shown in FIG. 12 is similar to the variable potential generating circuit shown in FIG. 3 except that (1) one third resistor element R is inserted (added) between the node A at one end of the resistor string and the fourth switching element $S_4$ and (2) one second resistor element (2R) and the current path of an NMOS transistor $Q_0$ whose gate is applied with the power supply potential Vcc are serially inserted (added) between the first node X and the connection node $A_0$ of the added third resistor element R and the fourth switching element $S_4$, and portions which are the same as those of FIG. 3 are denoted by the same reference numerals.

The variable output potential Vout output from the variable potential output node of the variable potential generating circuit of FIG. 12 is expressed by the product of the reference potential $V_R$ and the digital input as indicated by the following equation 7.

$$V_{out} = \left(1 + \frac{R_L}{R + R_D}\left(\frac{1}{2} + \frac{1}{2}\sum_{i=1}^{5} 2^{-i}Ai\right)\right)V_R \qquad \text{[Equation 7]}$$

When it is desired to change the variable output potential Vout by 32 steps in the step of 35.48 mV in a range of 1.636V to 2.736V, Vout can be easily calculated by use of the above equation if $V_R$ is 0.5V, R is fixedly set at 10 kΩ and the number of bits of the digital input is 5.

FIG. 13 shows the simulation result of the circuit shown in FIG. 12 and it is clearly seen that variable output potentials Vout1 to Vout32 of 32 steps (each step of 35.48 mV) from 1.636V to 2.736V are output at equal intervals as calculated.

Like the variable potential generating circuit of the first embodiment, in order to reduce the penetration current from the power supply Vcc to the ground potential node Vss in the standby state of the variable potential generating circuit shown in FIG. 13, it is desirable to set the first resistor element $R_L$ and fourth resistor element $R_D$ to a high resistance and, for example, $R_D$=190 kΩ and $R_L$=908.4 kΩ.

In the operative state of the variable potential generating circuit shown in FIG. 12, it is desirable to set the first resistor element $R_L$ and fourth resistor element $R_D$ to a low resistance in order to enhance the response speed of rising even if a small amount of penetration current flows, and the third switching element $S_3$ and fourth switching element $S_4$ are set in the ON state and, for example, $R_D$=0Ω (short circuit) and $R_L$=45.42 kΩ.

In this example, the resistance ratio $R_L/(R+R_D)$ is constant as indicated by the following equation.

$$R_L/(R+R_D)=908.4/(10+190)=45.42/(10+0)=4.542$$

Therefore, the variable output potentials Vout in the standby state and in the operative state of the variable potential generating circuit shown in FIG. 9 can be set to exactly the same potential in principle.

In the embodiments and modifications described above, a case wherein the number of bits of the digital input is 5 is explained, but circuits can be easily constructed simply by increasing or reducing the number of switches and resistors in the D/A converter circuit in cases wherein the bit number is 1 to 4 or larger than 5.

That is, according to the variable potential generating circuit of this invention, a variable output potential Vout can be minutely changed and generated in a multistage fashion by a relatively simple combination of resistors.

Therefore, the operation margin of the influence on the power supply voltage and the influence by the temperature characteristic of a semiconductor integrated circuit device containing the variable potential generating circuit and using the variable output potential Vout can be enlarged. Further, a variation in the elements caused by the variation in the manufacturing process can be easily coped with by minutely adjusting the variable output potential Vout, and as a result, the manufacturing yield of the semiconductor integrated circuit device can be enhanced.

The application range of the variable potential generating circuit is wide and the circuit can be applied to a multistage high power supply potential generating circuit of an electrically rewritable nonvolatile semiconductor memory (EEPROM), a word line driving power supply, dummy word line driving power supply, internal power supply, and memory cell data sensing reference potential generating circuit of other semiconductor memories. Next, an example in which the variable potential generating circuit is applied to a multistage high power supply potential generating circuit in an EEPROM is explained.

A NAND cell type flash memory using an array of cell units (NAND cells) each including a plurality of series-connected memory cells is known as a memory among the EEPROMs which can be easily integrated with high density and in which simultaneous erasing can be effected. One memory cell in the NAND cell type flash memory has an FETMOS structure in which a floating gate (charge storage layer) and a control gate are stacked above the semiconductor substrate in which the source and drain regions are formed with an insulating film disposed therebetween. Every adjacent two of a plurality of memory cells commonly use the source and drain regions and thus the plurality of memory cells are serially connected to constitute the NAND cell and the NAND cells are arranged in a matrix form to constitute the memory cell array.

In this case, each bit line is arranged in the column direction and the drains on one side of the NAND cells arranged in the column direction of the memory cell array are commonly connected to a corresponding one of the bit lines via the selection gate transistors and the sources on the other side thereof are connected to a common source line via other selection gate transistors. The control gates of the cell transistors are continuously arranged in the row direction to form control gate lines (word lines) and the gates of the selection gate transistors are continuously arranged in the row direction to form selection gate lines.

Such a NAND type flash memory is disclosed in, for example, K. D. Suh et al., "A 3.3V 32 Mb NAND Flash Memory with Incremental Step Pulse Programming Scheme," IEEE J. Solid-State Circuits, vol. 30, No. 11, pp. 1149–1156, Nov. 1995.

Figure 14A:
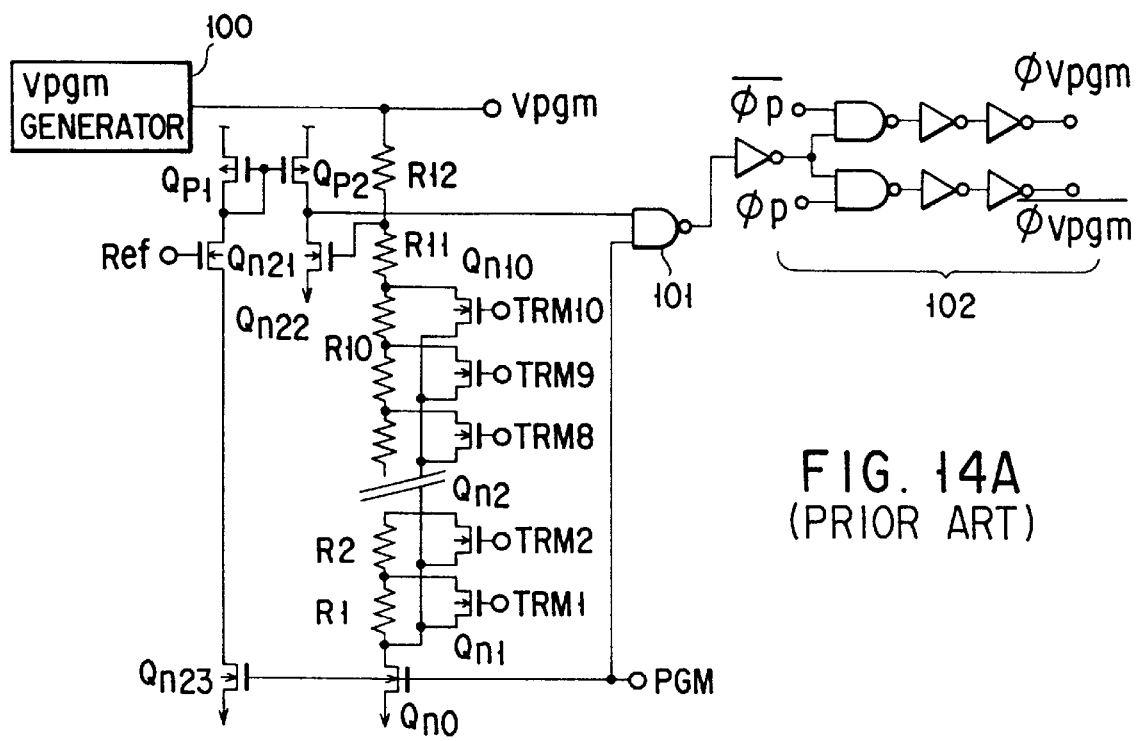
FIG. 14A is a circuit diagram showing an example of the construction of a programming voltage generating circuit (booster circuit) and a voltage limiter circuit used in a conventional NAND cell type flash memory.

In FIG. 7 of the above document, the circuit construction shown in FIG. 14A is shown as a voltage limiter circuit and a Vpgm generating circuit for generating a programming voltage Vpgm supplied to the word line or the like at the data programming or erasing time.

In FIG. 14A, a voltage limiter circuit connected between an output node (Vpgm node) of a program voltage (Vpgm) generating circuit 100 and a ground potential node Vss includes a voltage generating circuit section and a voltage comparing circuit section. The voltage generating circuit section includes voltage dividing resistors R12 to R1, NMOS transistor Qn0 and switch selection NMOS transistors Qn1 to Qn10. The resistors R12 to R1 and the current path of the NMOS transistor Qn0 are serially connected between the Vpgm node and the ground potential node Vss. One-side ends of the current paths of the NMOS transistors Qn1 to Qn10 are respectively connected to one-side ends of the resistors R1 to R10 and the other ends thereof are commonly connected to a connection node of the resistor R1 and the NMOS transistors. The gates of the NMOS transistors Qn1 to Qn10 are supplied with control signals TRM1 to TRM10. The gate of the NMOS transistor Qn0 is supplied with a control signal PGM.

The voltage comparing circuit section is a differential type operational amplifier circuit including PMOS transistors Qp1, Qp2 and NMOS transistors Qn21, Qn22, Qn23. A voltage of the connection node of the resistors R11 and R12 of the voltage generating circuit section is supplied to the gate of the NMOS transistor Qn22 which is one of the driving MOS transistors. Further, a reference voltage Ref generated from a reference voltage generating circuit (not shown) is supplied to the gate of the NMOS transistor Qn23 which is the other driving MOS transistor and is compared with the voltage of the connection node of the resistors R11 and R12.

The control signal PGM is supplied to the gate of the NMOS transistor Qn23 in the voltage comparing circuit section and the comparison operation of the voltage comparing circuit is effected when the signal PGM is set to the "H" level and the NMOS transistor Qn23 is turned ON.

Further, a signal of the output node of the voltage comparing circuit section and the control signal PGM are input to a 2-input NAND circuit 101 and an output signal of the 2-input NAND circuit 101 is input to a clock output circuit 102. The clock output circuit 102 is controlled by clock signals φp, φ̄p and outputs output signals φvpgm, φ̄vpgm.

In the voltage limiter circuit with the above construction, whether the voltage of the connection node of the resistors R11 and R12 is higher or lower than the reference voltage Ref is determined and the output signals φvpgm, $\overline{\varphi vpgm}$ are activated according to the result of determination to control the interruption/active state of the operation of the Vpgm generating circuit 100. As a result, the potential of the Vpgm node is kept at a voltage (limit voltage) close to a constant value. Then, the potential difference between the Vpgm node and the ground potential node Vss is divided into a plurality of voltage components by the resistors R12 to R1 and one of the switch selection transistors Qn1 to Qn10 is controlled into a conductive state according to the control signals TRM1 to TRM10. Therefore, the limit voltage setting value can be adjusted by changing the control signals TRM1 to TRM10.

Figure 14B:
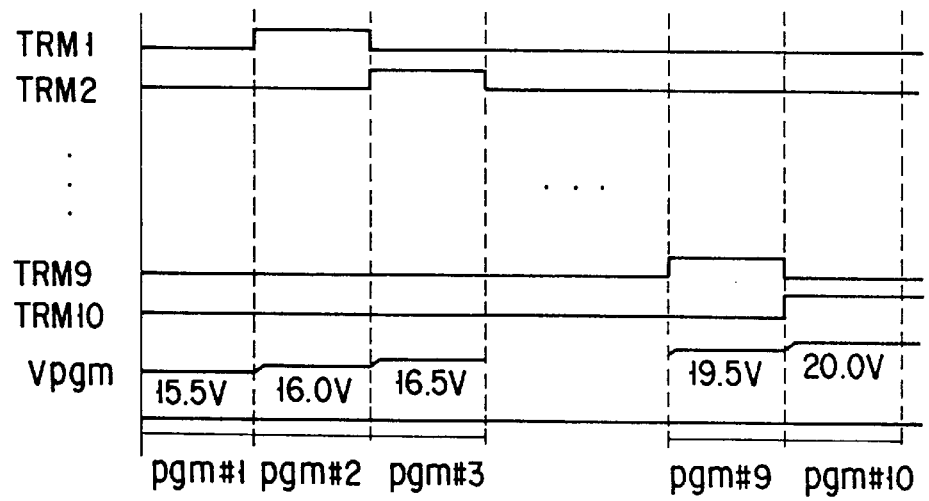
FIG. 14B is a timing chart for illustrating the operation of the circuit shown in FIG. 14A.

That is, as shown in FIG. 14B, when the transistor Qn1 is selected, 16.0V is output, when the transistor Qn2 is selected, 16.5V is output, and when the transistor Qn10 is selected, 20.0V is output. In this circuit, an output voltage can be generated in the step of 0.5V in the range of 15.5V to 20.0V.

However, the voltage limiter circuit shown in FIG. 14A has the following problem.

First, the control signals TRM1 to TRM10 are decoded signals and one decoder is required for one control signal TRMi (i=1 to 10). Therefore, as the number of divisions of the output voltage increases, the number of decoders to be used increases and the pattern area increases. Further, if the resistances of the resistors R1 to R12 are changed for some reason, it becomes necessary to change all of the resistances, and therefore, all of the resistances are minutely adjusted and it becomes difficult to minutely adjust and correct all of the resistances particularly if the number of divisions of the output voltage is large.

A case wherein the variable potential generating circuit according to this invention is applied to the voltage limiter circuit of a high voltage generating circuit (booster circuit) for supplying a high voltage to a word line (control gate) at the data programming time or erasing time in the NAND type EEPROM and a high voltage is generated in the small step of a desired level in a multistage fashion is explained below.

Third Embodiment

Figure 15:
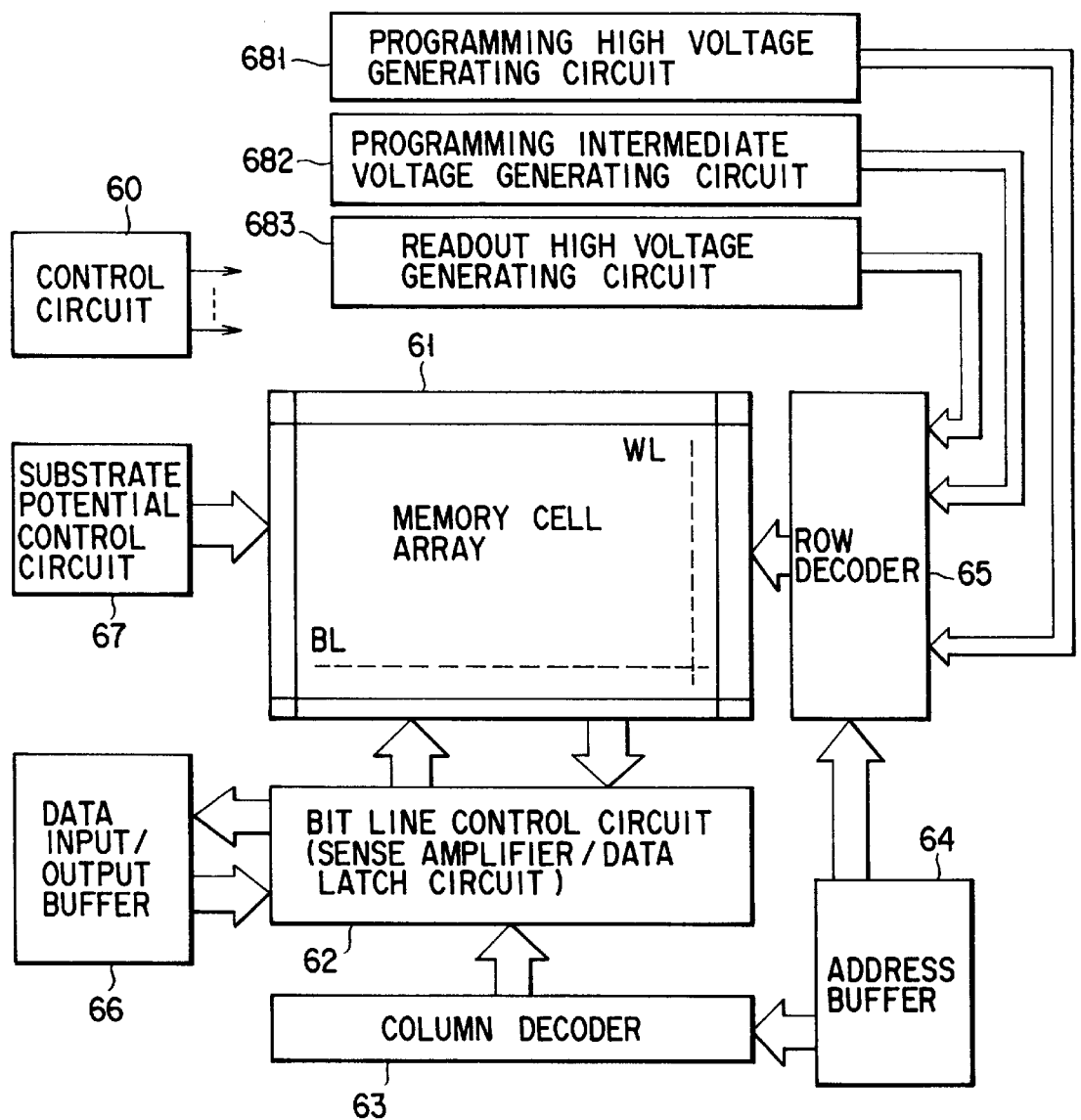
FIG. 15 is a block diagram schematically showing the whole construction of a NAND cell type EEPROM, for illustrating a semiconductor integrated circuit device according to a third embodiment of this invention.

FIG. 15 is a block diagram schematically showing the whole construction of a NAND cell type EEPROM. The EEPROM includes a memory cell array 61, bit line control circuit 62, column decoder 63, address buffer 64, row decoder 65, data input/output buffer 66, substrate potential control circuit 67, programming high voltage generating circuit 681, programming intermediate voltage generating circuit 682, readout high voltage generating circuit 683 and control circuit 60.

The memory cell array 61 has NAND cell units arranged in a matrix form and each NAND cell unit including a plurality of memory cell transistors whose current paths are serially connected and selection gate transistors whose current paths are respectively connected in series with the ends of the series circuit of the memory cell transistors. In the memory cell array 61, a plurality of word lines WL are each connected to the control gates of the cell transistors on the same row, the selection gate transistor connected to the drain on one end side of each NAND cell is connected to a corresponding one of bit lines, and the other selection gate transistor connected to the source on the other end side of each NAND cell is connected to a common source line. The bit line control circuit 62 includes column selection switches for effecting the column selection with respect to the memory cell array 61, a sense amplifier/programming data latch circuit for effecting the programming data latching operation, the sense operation for reading the bit line potential, the sense operation for verifying and reading after programming and the re-programming data latching operation with respect to the memory cell array 61, and a bit line driver for supplying a desired voltage to the bit line. The bit line control circuit 62 is connected to the data input/output buffer 66. The column decoder 63 decodes a column address signal from the address buffer 64 and controls the column selection switches according to the decoded output. The row decoder 65 includes a decoder circuit for decoding a row address signal from the address buffer 64, and a word line driver for supplying desired voltages to the word line WL and selection gate line according to the decoded output of the decoder circuit. The word line driver in the row decoder 65 is supplied with a programming high voltage, programming intermediate voltage and readout high voltage from the high voltage generating circuit which will be described later in addition to the power supply potential Vcc and ground potential (0V). Further, the bit line driver in the bit line control circuit 62 is supplied with the power supply potential Vcc and ground potential (0V). The substrate potential control circuit 67 is provided to control the potential of the p-type substrate (or p well) in which the memory cell array 61 is formed. The programming high voltage generating circuit 681, programming intermediate voltage generating circuit 682 and readout high voltage generating circuit 683 are provided in the chip to raise the power supply potential Vcc (for example, 3.3V) and generate a programming high voltage ($\simeq$20V) necessary for programming data into the memory cell, a programming intermediate voltage ($\simeq$10V) and a readout high voltage ($\simeq$4.5V) necessary for verifying and reading after programming. The control circuit 60 is provided to control the operation of the internal portion of the chip and interface with the exterior and includes a sequence control circuit (for example, a programmable logic array) for controlling various operations such as erasing/erasing verify/programming/programming verify/readout operations with respect to the NAND cell.

The high voltage generating circuits 681 to 683 are formed of substantially the same circuits and each include a booster circuit for raising the power supply potential Vcc to obtain a high voltage, an oscillator circuit such as a ring oscillator oscillating in a preset cycle to supply 2-phase or 4-phase clock signals φ, $\overline{\varphi}$ to the booster circuit as the driving signal, and a voltage limiter circuit for limiting the high voltage obtained in the booster circuit to a desired constant level.

Figure 16:
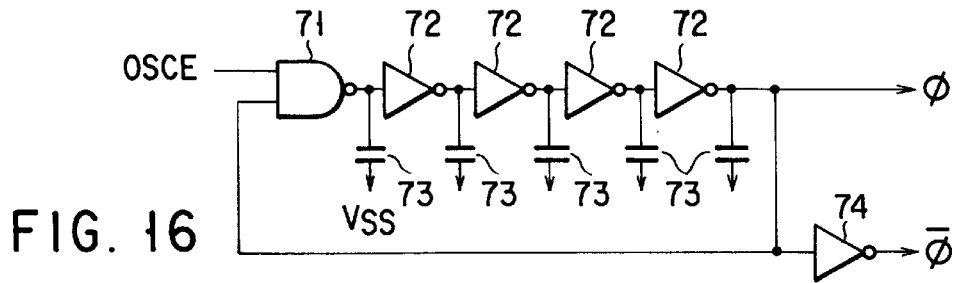
FIG. 16 is a circuit diagram showing a ring oscillator as an example of an oscillation circuit used in each high voltage generating circuit in the EEPROM shown in FIG. 15.

FIG. 16 shows a ring oscillator as an example of the oscillation circuit used in the high voltage generating circuits 681 to 683 in the EEPROM shown in FIG. 15. The ring oscillator includes a 2-input NAND circuit 71, even stage of inverter circuits 72, inverter circuit 74, and capacitor 73. The 2-input NAND circuit 71 is supplied with an oscillation enable signal OSCE and the feedback signal of the output clock signal φ. The 2-input NAND circuit 71 and the even stage of inverter circuits 72 are connected in a ring form and the capacitors 73 are connected between the Vss node and the output terminals of the 2-input NAND circuit 71 and inverter circuits 72. The clock signal φ output from the final stage inverter circuit 72 is inverted by the inverter circuit 74 and is output as a clock signal $\overline{\varphi}$.

Figure 17:
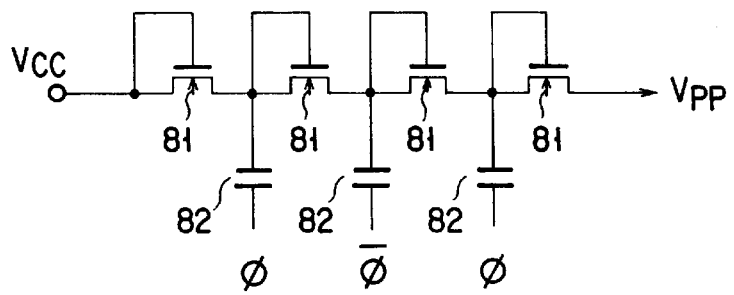
FIG. 17 is a circuit diagram typically showing a Vpp generating circuit in the booster circuit used in each high voltage generating circuit in the EEPROM shown in FIG. 15.

FIG. 17 shows a Vpp generating circuit as a typical one of the booster circuits used in the high voltage generating circuits 681 to 683 in the EEPROM shown in FIG. 15. The booster circuit is constructed by use of charge pump circuits cascade connected in a multistage fashion. As is well known in the art, the construction of the charge pump circuits includes MOS transistors 81 whose source and gate are connected and capacitors 82 which are each connected at one end to the drain of a corresponding one of the MOS transistors and are alternately applied at the other end with the clock signals $\phi$ and $\overline{\phi}$ supplied from the oscillation circuit shown in FIG. 16 and a high voltage (in this example, Vpp) is generated at the booster output node in a state in which the 2-phase clock signals $\phi$ and $\overline{\phi}$ are alternately made active.

Figure 18:
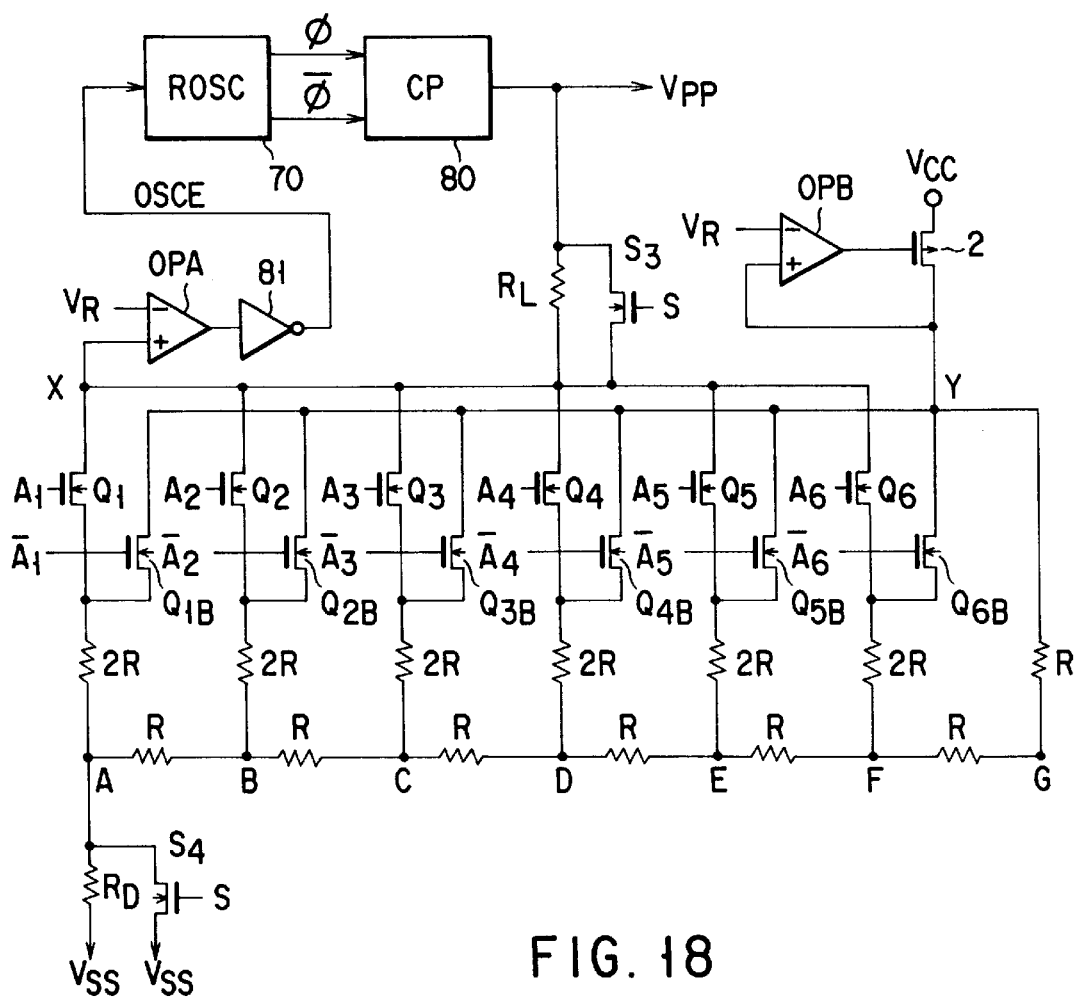
FIG. 18 is a circuit diagram typically showing a Vpp limiter circuit in the voltage level setting circuit (voltage limiter circuit) used in each high voltage generating circuit in the EEPROM shown in FIG. 15.

FIG. 18 shows a Vpp limiter circuit as a typical one of the voltage limiter circuits used in the high voltage generating circuits 681 to 683 in the EEPROM shown in FIG. 15. The Vpp limiter circuit is connected to the output node of the Vpp generating circuit (charge pump circuit CP) 80 shown in FIG. 17 and is obtained by modifying part of the variable potential generating circuit shown in FIG. 3, and portions which are the same as those of FIG. 3 are denoted by the same reference numerals.

The PMOS transistor 1 in the variable potential generating circuit shown in FIG. 3 is omitted, one end (variable potential output node) of the first resistor element $R_L$ is connected to the output node of the Vpp generating circuit and a signal obtained by inverting an output of the first operational amplifier OPA by use of an inverter circuit 81 is supplied as the oscillation enable signal OSCE of the ring oscillator (ROSC) 70 shown in FIG. 16.

As the resistor circuit network of the D/A converter circuit in the above Vpp limiter circuit, six sets of switching circuits $Q_1$ to $Q_6$ and $Q_{1B}$ to $Q_{6B}$ for coping with six-bit digital inputs $A_1$ to $A_6$ and $\overline{A_1}$ to $\overline{A_6}$ and a six-stage R-2R ladder resistor circuit network are used.

Assuming now that the output voltage of the Vpp generating circuit 80 is lowered for some reason, then the output of the first operational amplifier OPA is set to the "L" level and the output (oscillation enable signal OSCE) of the inverter circuit 81 is set to the "H" level, and the ring oscillator 70 oscillates in a cycle determined by the circuit characteristic to alternately activate the 2-phase clock signals $\phi$ and $\overline{\phi}$ so as to operate the Vpp generating circuit 80 and the output voltage Vpp is raised.

If the output voltage of the Vpp generating circuit 80 becomes excessively high, the output of the first operational amplifier OPA is set to the "H" level and the output (oscillation enable signal OSCE) of the inverter circuit 81 is set to the "L" level, and the operation of the ring oscillator 70 is interrupted to interrupt the voltage raising operation of the Vpp generating circuit 80. As a result, the voltage Vpp of the Vpp generating circuit 80 is gradually lowered by a current flowing from the output node of the Vpp generating circuit 80 into the Vpp limiter circuit.

By repeatedly effecting the feedback operation described above, the output voltage is stabilized at Vpp.

If the reference potential $V_R=0.5V$ and the resistance ratio $R_L/(R+R_D)=64$, then the variable potential Vpp can be expressed by the product of the reference potential $V_R$ and the digital input bit signals $A_1$ to $A_6$ as indicated by the following equation.

$$V_{pp} = \left(1 + \frac{R_L}{R+R_D}\sum_{i=1}^{6} 2^{-i} A i\right) V_R \quad \text{[Equation 8]}$$

According to the equation 8, when all of the bit signals $A_1$ to $A_6$ are "0", Vpp=0.5V and when all of the bit signals $A_1$ to $A_6$ are "1", Vpp=32V. That is, the voltage can be generated with the step width of 0.5V and voltages of 64 levels can be generated.

At this time, the resistor elements used in the 6-stage R-2R ladder resistor circuit network include six resistor elements of R and seven resistor elements of 2R and the total number of resistor elements used in the whole Vpp limiter circuit is 15 even if $R_L$ and $R_D$ are included and thus the number of resistor elements can be greatly reduced.

Further, an amount of current flowing in the resistive potential dividing circuit can be freely changed without changing the output voltage Vpp by changing the resistances of the resistor elements $R_L$ and $R_D$ with the resistance ratio $R_L/(R+R_D)$ kept unchanged. In other words, even if the resistance of the resistor element is changed for some reason, a desired amount of current can be determined simply by adjusting the resistances of the two resistor elements $R_L$ and $R_D$. Therefore, the Vpp generating circuit can be easily designed and the pattern area can be reduced.

The variable potential generating circuit according to this invention is not limited to the voltage limiter circuit of the high voltage generating circuit (booster circuit) described above and can be applied to voltage limiter circuits of various power supply voltage generating circuits and the effect thereof becomes more significant as the number of variable voltage steps becomes larger.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor integrated circuit device comprising:
   a resistive potential divider circuit including a switching element and a current-scaling type digital/analog converter circuit connected in series between first and second potential nodes and having a variable potential output node for outputting a variable potential, a first node at which a divided potential obtained by resistive division of the variable potential appears, and a second node to which a virtual potential is applied;
   a first operational amplifier for comparing one of the divided potential of the first node and the virtual potential of the second node with a reference potential to effect the feedback control for setting said one of the divided potential and the virtual potential equal to the reference potential; and
   a voltage application circuit for controlling the other of the divided potential of the first node and the virtual potential of the second node substantially equal to the reference potential.

2. A semiconductor integrated circuit device according to claim 1, wherein said current-scaling type digital/analog converter circuit includes a switching circuit network which is selectively controlled to a state for selecting the first node and a state for selecting the second node in response to the bit signals of the digital input, and a resistor circuit network formed of a combination of a second resistor element group and a third resistor element group and connected to said switching circuit network, and said resistive potential divider circuit includes a first resistor element connected between the variable output node and the first node and a fourth resistor element connected between said resistor circuit network and the ground node.

3. A semiconductor integrated circuit device according to claim 2, wherein the resistance ratio of the second resistor element group to the third resistor element group is 1:2 and said resistor circuit network is an R-2R type ladder resistor circuit network.

4. A semiconductor integrated circuit device according to claim 2, further comprising means for lowering the resistances of the first and fourth resistor elements with the resistances of the second resistor element group and the third resistor element group kept constant.

5. A semiconductor integrated circuit device according to claim 1, wherein said voltage application circuit includes a second operational amplifier for comparing the other of the divided potential of the first node and the virtual potential of the second node with the reference potential and effecting the feedback control to set the other of the divided potential and the virtual potential equal to the reference potential.

6. A semiconductor integrated circuit device according to claim 5, wherein said second operational amplifier has one input terminal applied with the reference potential and the other input terminal applied with the virtual potential fed back from the second node and constitutes a voltage follower.

7. A semiconductor integrated circuit device according to claim 5, wherein said second operational amplifier has one input terminal applied with the divided potential of the first node and the other input terminal applied with the virtual potential fed back from the second node.

8. A semiconductor integrated circuit device according to claim 1, wherein said voltage application circuit includes a PMOS transistor having a source-drain path connected between the power supply node and the second node and a gate applied with a potential of the output terminal of said first operational amplifier, for effecting the feedback control to set the potential of the second node equal to the reference potential.

9. A semiconductor integrated circuit device according to claim 1, wherein the first potential is a power supply potential and the second potential is a ground potential.

10. A semiconductor integrated circuit device comprising:
a first PMOS transistor connected between a power supply node and a variable potential output node;
a first resistor element connected at one end to the variable potential output node;
a plurality of first switching elements commonly connected at one-side ends thereof to a first node on the other end side of said first resistor element, the switching states of said first switching elements being controlled by respective bit signals of a digital input;
a plurality of second switching elements commonly connected at one-side ends thereof to a second node and respectively connected at the other ends to the other ends of said first switching elements, the switching states of said second switching elements being controlled by signals which are complementary to the respective bit signals of the digital input;
a ladder resistor circuit network having a plurality of second resistor elements and a plurality of third resistor elements connected in a ladder form, said second resistor elements being connected at one-side ends thereof to a plurality of connection nodes of said plurality of first switching elements and said plurality of second switching elements and said third resistor elements being string-connected;
a fourth resistor element connected between one end of said plurality of third resistor elements string-connected in said ladder resistor circuit network and a ground node;

a first operational amplifier for comparing a divided potential obtained at the first node with the reference potential and controlling a gate potential of said first PMOS transistor based on a comparison output to effect the feedback control to set the divided potential equal to the reference potential; and
a voltage application circuit for applying a virtual potential which is substantially equal to the reference potential to the second node.

11. A semiconductor integrated circuit device according to claim 10, further comprising a third switching element connected between the intermediate node of said first resistor element and the first node and a fourth switching element connected in parallel with said fourth resistor element, said third and fourth switching elements being controlled into an ON state in the operative state and controlled into an OFF state in a standby state.

12. A semiconductor integrated circuit device according to claim 10, wherein said voltage application circuit includes a second PMOS transistor connected between the power supply node and the second node and a second operational amplifier for comparing the virtual potential of the second node with the reference potential to control the gate potential of said second PMOS transistor based on the comparison output and effecting the feedback control to set the virtual potential of the second node equal to the reference potential.

13. A semiconductor integrated circuit device according to claim 12, wherein said voltage application circuit includes a second PMOS transistor connected between the power supply node and the second node and a second operational amplifier for comparing the virtual potential of the second node with the divided potential of the first node to control the gate potential of said second PMOS transistor based on the comparison output and effecting the feedback control to set the virtual potential of the second node equal to the reference potential.

14. A semiconductor integrated circuit device according to claim 10, wherein said voltage application circuit includes a second PMOS transistor having a source-drain path connected between the power supply node and the second node and a gate applied with a potential of the output node of said first operational amplifier and effecting the feedback control to set the potential of the second node substantially equal to the reference potential.

15. A semiconductor integrated circuit device according to claim 1, further comprising load elements respectively connected to the connection nodes of said plurality of third resistor elements string-connected and each having a resistance which is half the ON-resistance of each of said plurality of first switching elements and said plurality of second switching elements when they are turned ON.

16. A semiconductor integrated circuit device according to claim 10, wherein each of said plurality of first switching elements and said plurality of second switching elements has a CMOS circuit construction in which the current paths of a PMOS transistor and an NMOS transistor are connected in parallel.

17. A semiconductor integrated circuit device according to claim 10, wherein said first resistor element, said plurality of second resistor elements and said plurality of third elements are each formed of an integral number of unit resistor elements.

* * * * *